US006703267B2

(12) United States Patent
Tanabe et al.

(10) Patent No.: US 6,703,267 B2
(45) Date of Patent: Mar. 9, 2004

(54) METHOD OF MANUFACTURING THIN FILM TRANSISTOR

(75) Inventors: Hiroshi Tanabe, Tokyo (JP); Katsuhisa Yuda, Tokyo (JP); Hiroshi Okumura, Tokyo (JP); Yoshinobu Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/231,045

(22) Filed: Aug. 30, 2002

(65) Prior Publication Data

US 2003/0013239 A1 Jan. 16, 2003

Related U.S. Application Data

(62) Division of application No. 09/900,007, filed on Jul. 9, 2001, now Pat. No. 6,444,508, which is a division of application No. 09/451,867, filed on Dec. 1, 1999, now Pat. No. 6,258,638, which is a division of application No. 09/033,609, filed on Mar. 3, 1998, now Pat. No. 5,998,838.

(30) Foreign Application Priority Data

Mar. 3, 1997 (JP) .............................. 9-047874
Mar. 13, 1997 (JP) .............................. 9-059152

(51) Int. Cl.$^7$ .............................................. H01L 21/00
(52) U.S. Cl. ...................... 438/164; 438/163; 438/166; 438/787
(58) Field of Search ................. 438/164, 166, 438/163, 787

(56) References Cited

U.S. PATENT DOCUMENTS

| | | | |
|---|---|---|---|
| 4,070,211 A | * | 1/1978 | Harari .......................... 438/164 |
| 5,292,675 A | | 3/1994 | Cudama |
| 5,698,882 A | | 12/1997 | Park |
| 5,767,531 A | | 6/1998 | Yoshinouchi |
| 5,817,549 A | | 10/1998 | Yamazaki et al. |
| 6,077,574 A | | 6/2000 | Usami |
| 6,136,685 A | | 10/2000 | Narwankar et al. |
| 6,238,588 B1 | | 5/2001 | Collins et al. |
| 6,335,542 B2 | | 1/2002 | Miyasaka |
| 6,534,350 B2 | * | 3/2003 | Chen et al. .................. 438/163 |

FOREIGN PATENT DOCUMENTS

| | | |
|---|---|---|
| JP | 3-19340 | 1/1991 |
| JP | 3-108319 | 5/1991 |
| JP | 3-120871 | 5/1991 |
| JP | 3-241873 | 10/1991 |
| JP | 6-61490 | 3/1994 |
| JP | 6-85258 | 3/1994 |
| JP | 8-70127 | 3/1996 |
| JP | 8-107214 | 4/1996 |
| JP | 10-51005 | 2/1998 |

OTHER PUBLICATIONS

M. Sekiya et al., "High Performance Poly–Crystalline Silicon Thin Film Transistors Fabricated Using Remote Plasma Chemical Vapor Deposition of $SiO_2$," IEEE Electron Device Letters (1994) vol. 15, No. 2, pp. 69–71.

* cited by examiner

*Primary Examiner*—Amir Zarabian
*Assistant Examiner*—Christy Novacek
(74) *Attorney, Agent, or Firm*—Foley & Lardner

(57) ABSTRACT

In a thin film transistor, a first insulating film on a silicon layer formed in an island on a substrate is smaller in thickness than the silicon layer so that the stepped island edges is gentle in slope to facilitate covering the island with a second insulating film. This reduces occurrence of gate leak considerably. Since the peripheral region of the stepped island is smaller in thickness than the central region above the channel, it is possible to minimize occurrence of gate electrode breakage. The silicon layer contains two or more inert gas atoms, and the atoms smaller in mass number (e.g., He) are contained in and near an interface with a silicon active layer while the atoms larger in mass number (e.g., Ar) than those smaller in mass number are contained in and near a second interface with a gate electrode.

1 Claim, 16 Drawing Sheets

(a) TOP PLAN VIEW (b) A – A' CROSS – SECTIONAL VIEW (c) B – B' CROSS – SECTIONAL VIEW (a) TOP PLAN VIEW (b) A – A' CROSS – SECTIONAL VIEW (c) B – B' CROSS – SECTIONAL VIEW (a) TOP PLAN VIEW (b) A–A' CROSS–SECTIONAL VIEW (c) B–B' CROSS–SECTIONAL VIEW

B – B' CROSS – SECTIONAL VIEW

Fig.5 (a)
1: GLASS SUBSTRATE
Fig.5 (b)
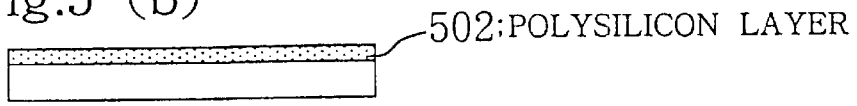
502: POLYSILICON LAYER
Fig.5 (c)
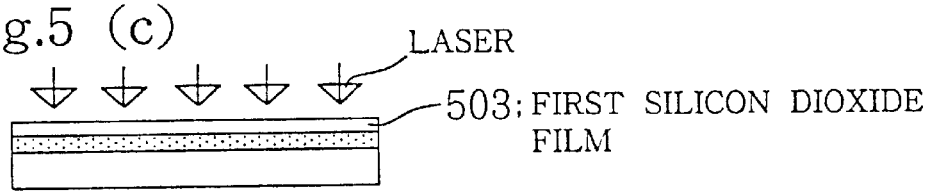
LASER
503: FIRST SILICON DIOXIDE FILM
Fig.5 (d)
Fig.5 (h)
Fig.5 (e)
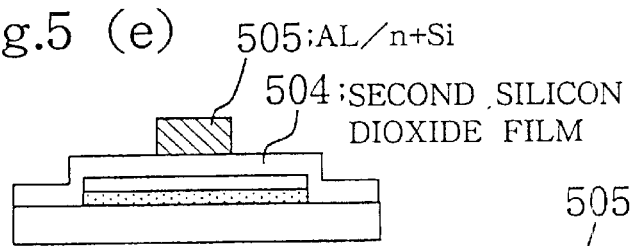
505: AL/n+Si
504: SECOND SILICON DIOXIDE FILM
Fig.5 (i)
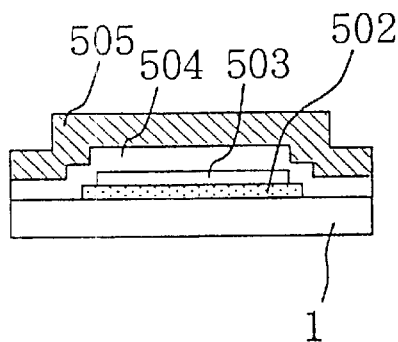
505 504 503 502
1
Fig.5 (f)
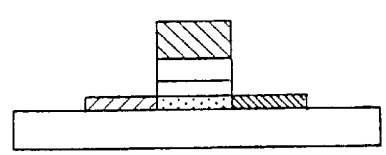
Fig.5 (g)
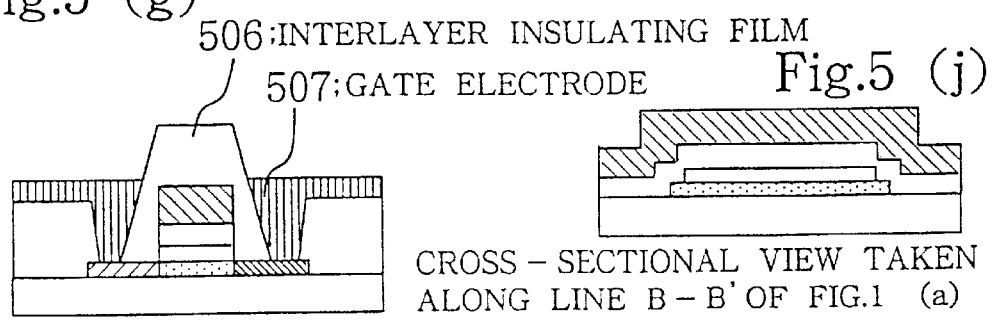
506: INTERLAYER INSULATING FILM
507: GATE ELECTRODE
Fig.5 (j)
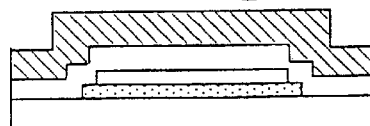
CROSS–SECTIONAL VIEW TAKEN ALONG LINE B–B' OF FIG.1 (a)
CROSS–SECTIONAL VIEW TAKEN ALONG LINE A–A' OF FIG.1 (a)

1: GLASS SUBSTRATE

502: POLYSILICON LASER

503: FIRST SILICON DIOXIDE FILM

505: AL/n+Si
504: SECOND SILICON DIOXIDE FILM 505 504 503 502

CROSS-SECTIONAL VIEW TAKEN ALONG LINE A-A' OF FIG.2 (a)

CROSS-SECTIONAL VIEW TAKEN ALONG LINE B-B' OF FIG.2 (a)

Fig.9 (a) PRIOR ART
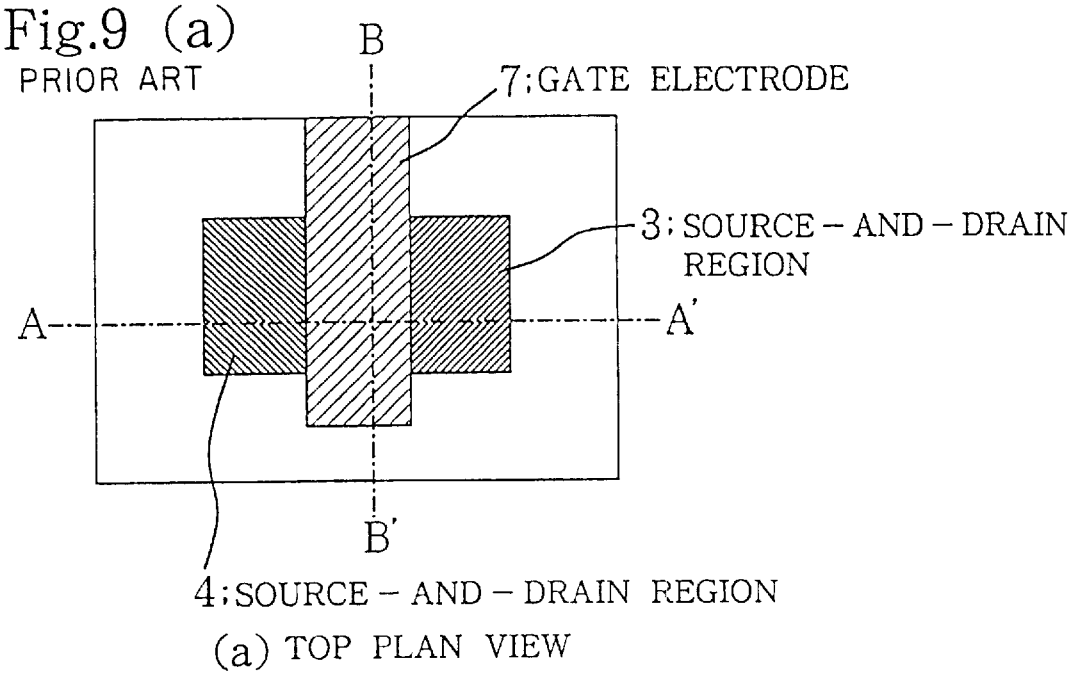
(a) TOP PLAN VIEW
Fig.9 (b) PRIOR ART
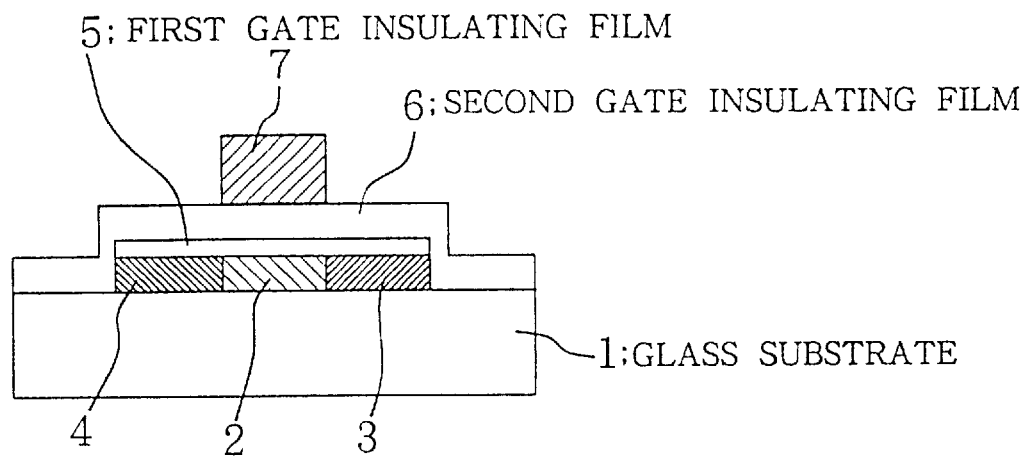
(b) A – A' CROSS – SECTIONAL VIEW
Fig.9 (c) PRIOR ART
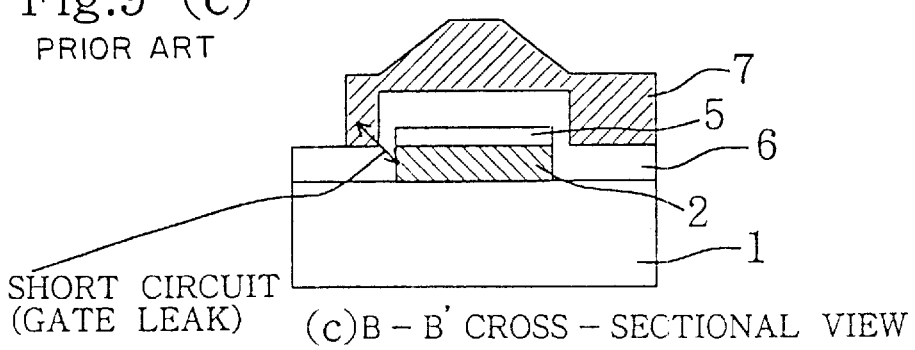
SHORT CIRCUIT (GATE LEAK)
(c) B – B' CROSS – SECTIONAL VIEW Fig.11 (a) PRIOR ART
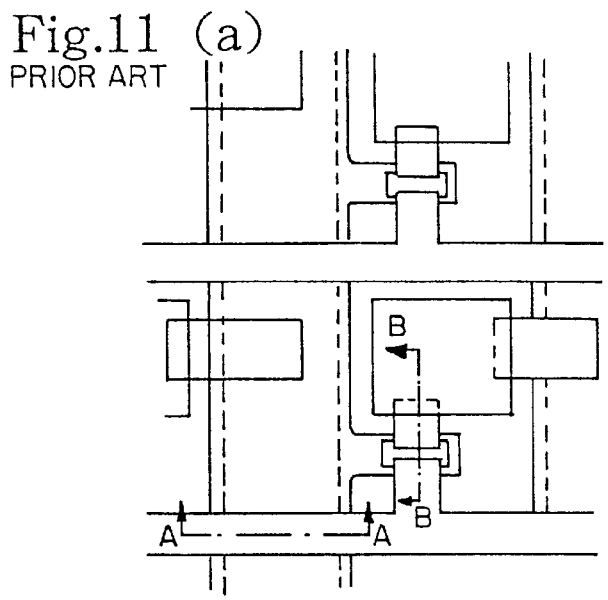
Fig.11 (b) PRIOR ART
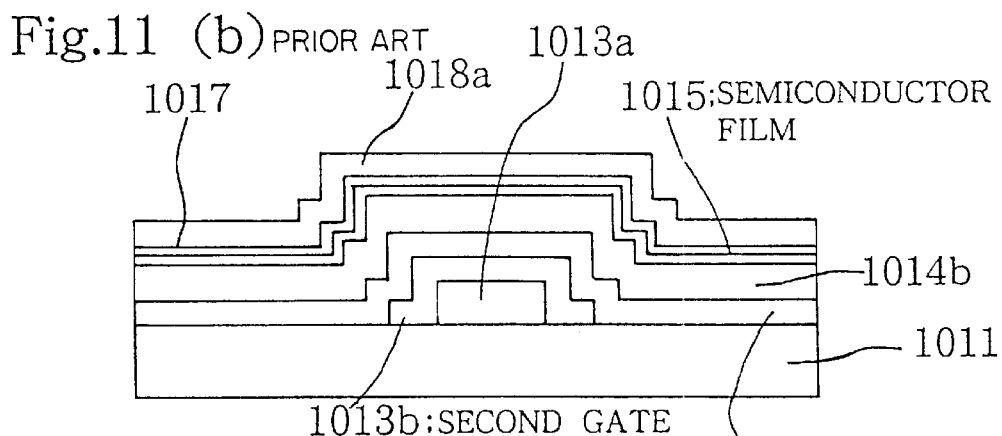
Fig.11 (c) PRIOR ART
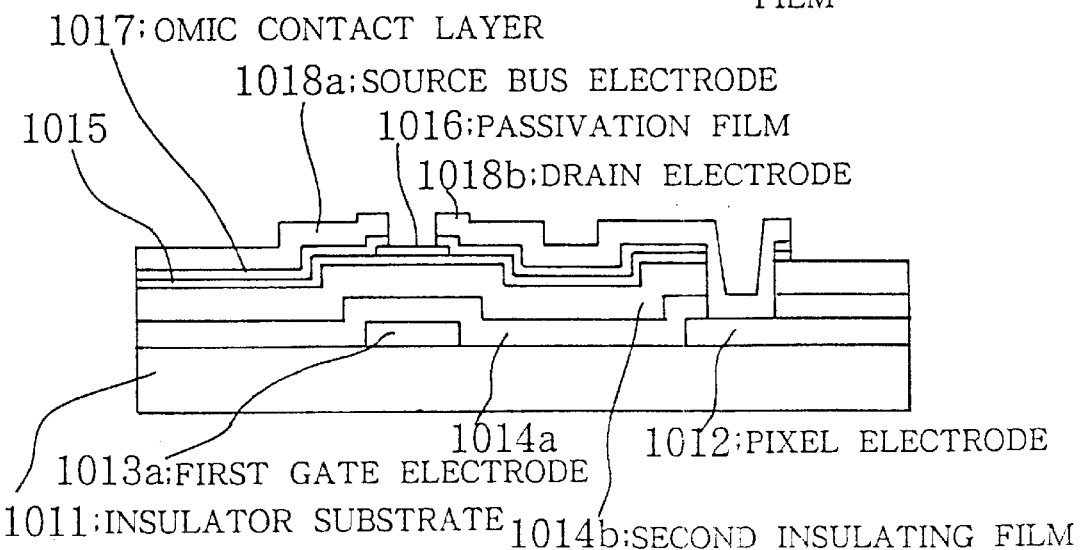

Fig.17 (a)
61: GLASS SUBSTRATE
Fig.17 (b)
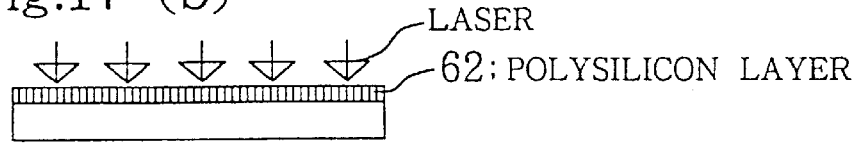
LASER
62: POLYSILICON LAYER
Fig.17 (c)
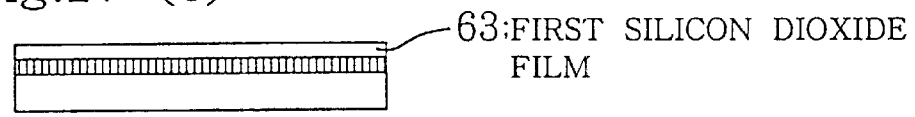
63: FIRST SILICON DIOXIDE FILM
Fig.17 (d)
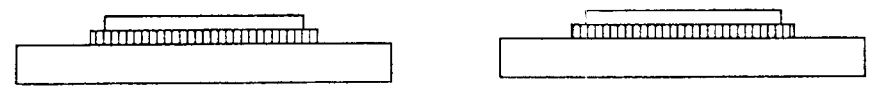
Fig.17 (h)
Fig.17 (e)
65: AL/n+Si
64: SECOND SILICON DIOXIDE FILM
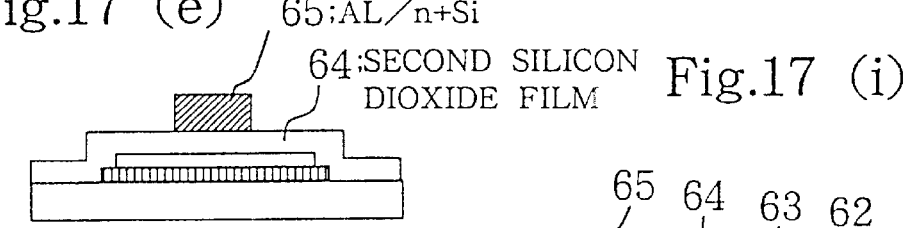
Fig.17 (i)
Fig.17 (f)
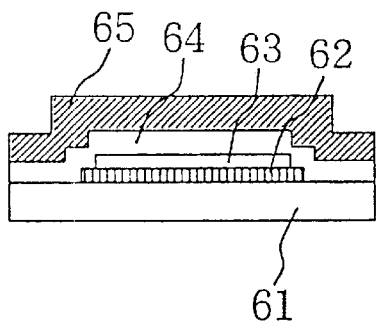
Fig.17 (g)
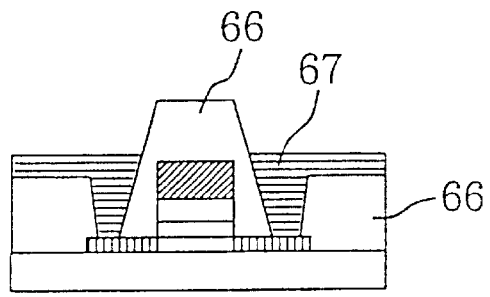
66
67
66
Fig.17 (j)
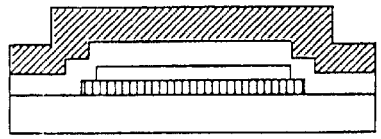

METHOD OF MANUFACTURING THIN FILM TRANSISTOR

CROSS-REFERENCE TO RELATED PATENT APPLICATIONS

This application is a division of application Ser. No. 09/900,007, filed Jul. 9, 2001, now U.S. Pat. No. 6,444,508; which is a division of application Ser. No. 09/451,867, filed Dec. 1, 1999, now U.S. Pat. No. 6,258,638, issued Jul. 10, 2001; which is a division of application Ser. No. 09/033,609, filed Mar. 3, 1998, now U.S. Pat. No. 5,998,838, issued Dec. 7, 1999, and based on Japanese Patent Applications No. 9-047874, filed Mar. 3, 1997, and No. 9-059152, filed Mar. 3, 1997, by Hiroshi Tanabe, Katsuhisa Yuda, Hiroshi Okumura and Yoshinobu Sato. This application claims only subject matter disclosed in the parent application and therefore presents no new matter.

BACKGROUND OF THE INVENTION

1. Field of the Invention

The present invention relates to a thin film transistor for use in an active matrix liquid crystal display panel, an input/output device as of a contact-type image sensor, a portable electronic instrument, etc., and also to a method for manufacturing such thin film transistor.

2. Description of the Related Art

In forming a thin film transistor (hereinafter also called TFT) on a substrate of glass, the hydrogenated amorphous silicon semiconductor TFT technology and the polysilicon TFT technology are currently available as typical technologies. According to the former, the maximum temperature of the fabrication process is about 300°, and a carrier mobility of approximately 1 $cm^2$/Vsec is obtained. According to the latter, using a high-temperature process analogous to the LSI process of about 1000° C. using a substrate as of quartz, a carrier mobility of 30 to 100 1 $cm^2$/Vsec can easily be obtained. In case of the high carrier mobility, when the thin film transistor is applied to, for example, a liquid crystal display, it is possible to simultaneously form on the same glass substrate a pixel TFT driving each pixel and even a peripheral driving circuit section as well. The resulting thin film transistor is inexpensive and small-sized.

However, in the polysilicon TFT technology, inexpensive low-melting-point glass, which is originally suitable to the former process, cannot be employed in the above-mentioned high-temperature process. For decreasing the temperature of the polysilicon TFT process, the laser crystallization technology, the low temperature film (gate insulating film) formation technology and the low temperature interface (of insulating film and silicon) formation technology are sought after. Studies and developments have been made to solve the foregoing problems. To this end, IEEE ELECTRON DEVICE LETTERS, Vol. 15, No. 2, page 69, "High Performance Polycrystalline Silicon Thin Film Transistor Fabricated Using Remote Plasma CVD of $SiO_2$," (M. Sekiya, et al.) discloses a hybrid fabricating apparatus and method composed of two different fabrication processes: the laser crystallization for forming a good interface between an insulating film and a silicon layer at low temperature, and the remote plasma CVD for forming a silicon dioxide film. This hybrid concept aims to maintain a good insulating-film-and-silicon interface at low temperature by forming a gate insulating film on a high-quality polysilicon film, which is formed by the excimer laser crystallization without exposure to atmosphere, and by keeping the interface well clean. In this technological paper, as a polysilicon TFT fabrication process, the following process flow was proposed. After a source-and-drain layer (20 nm thick) has been formed in an island shape, a silicon layer (20 nm thick) is formed. Then, laser crystallization, hydrogen treatment (which comes immediately after laser crystallization) and fabrication of a first insulating film ($SiO^2$, 100 nm thick) take place in succession. As a result, a good insulating-film-and-silicon interface is obtained at low temperature. After that, the silicon layer is patterned in an island shape. In addition, a second insulating film (100 nm thick) is formed to secure silicon-electrode isolation.

In the meantime, as reduction of the power output and the driving voltage of a liquid display, an image sensor or the like has been practical, it is increasingly becoming necessary not only to improve the performance of TFT by cleaning the interface but also to reduce the operating threshold voltage of TFT. And it has turned out from recent studies that thinning the gate insulating film is effective for reduction of the operating threshold voltage; such thinning method applied to a planar thin film transistor will now be described with reference to FIGS. 9(a) to 9(c) of the accompanying drawings. FIG. 9(a) is a top plan view of the planar thin film transistor, FIG. 9(b) is a cross-sectional view taken alone line A–A' of FIG. 9(a), and FIG. 9(c) is a cross-sectional view taken along line B–B' of FIG. 9(a). A first insulating film 5 patterned in an island shape is located on and formed continuously with a semiconductor layer, which is adapted to be formed into a source-and-drain region 3, 4 and a channel region 2, and then a second insulating film 6 and a gate electrode (hereinafter also called simply the gate)7 are located over the first insulating film 2 so as to cover the semiconductor layer and the island of the first insulating film 5. Now for reducing the threshold voltage as mentioned above, it becomes necessary to reduce the total thickness of the two-layer gate insulating film 5, 6. This is because reduction of the two layers increases the capacitance so that an adequate electric field effect can be obtained even at low voltage. Whereas the semiconductor layer, unlike the gate insulating film, cannot be thinned, partly because it should be doped with an impurity as by ion implantation and partly because an adequate process margin during laser crystallization should be secured. Consequently, if the gate insulating film is thinned in order to lower the threshold voltage as mentioned above, then the thickness of the second gate insulating film becomes smaller than the difference between the semiconductor layer and the first gate insulating film so that gate-leak-free covering is difficult to achieve. Thus short circuit (gate leak) would tend to occur between the gate and the source-and-drain region.

As a solution for these problems, the following method was proposed by Japanese Patent Laid-Open Publication No. Hei6-85258. As shown in FIG. 10 of the accompanying drawings of the present specification, a semiconductor film 12 is formed in an island shape on an insulator substrate 11 and then a first insulating film 13 is formed on the island-shape semiconductor film 12, whereupon a second insulating film 21 is formed so as to cover the stepped peripheral edges of such composite island of the semiconductor film 12 and first insulating film 13. And a gate electrode 14 is formed over the first insulating film 13 surrounded by the second insulating film 21, so the semiconductor film 12 and the gate 14 are perfectly isolated from each other, preventing occurrence of short circuit (gate leak) between the semiconductor film 12 and the gate 14, i.e., between the gate and the source-and-drain. To realize such structure, the second insulating film 21 has to be etched selectively, namely, at only the region directly above the island after having been formed along its entire surface over the first insulating film 13. As a consequence, the second insulating film 21 requires a material such that it can be selectively etched with respect to the first insulating film 13 or the second insulating film 21 requires a selective etching process. Especially when the first insulating film 13 is thinned further in an effort to improve the throughput and performance, a much higher selective ratio is needed, and a dry etching method free of plasma damage to either the gate insulating film or the insulating-film-and-semiconductor interface would be necessitated.

As an alternative method that ensures inter-electrode isolation using a two-layer insulating film, Japanese Patent Laid-Open Publication No. Hei6-61490 discloses a conventional two-layer technology which optimizes the thickness and cross-sectional shape of each layer and employs two highly dielectric thin films for securing high performance of a thin film transistor. As shown in FIG. 11, this conventional method aims to provide a well-insulating, highly reliable isolation structure by optimizing the shape of a second insulating film 1014b rather than the shape of a first insulating film 1014a, which covers gates 103a, 1013b. Further, the gate metal as a prospective lower electrode is covered with tungsten oxide and then a silicon nitride film for forming a good MIS interface with hydrogenated amorphous silicon, whereupon a hydrogenated amorphous silicon film and a source-and-drain layer are formed. This conventional covering method using the two-layer insulating film is effective in covering the stepped regions defined by only the gate electrode and semiconductor layer. However, this publication is totally silent about and even does not anticipate any second insulating film that covers the stepped edges of the island constituted by the semiconductor layer and the first gate insulating film.

As the low temperature formation technology for a gate insulating film in particular, developments of means for forming a silicon dioxide film by plasma CVD, sputtering or low pressure CVD have increasingly become popular. The silicon dioxide film, which is formed at such a low temperature of less than about 600° as to enable the use of the above-described glass substrate, would be encountered with the following problems as compared to the thermally oxidized film to be used in the conventional LSI process.

For the bulk performance of the gate insulating film designated by (a) in FIG. 18 of the accompanying drawings of the present specification, it is required to reduce the defect level derived from residual stress, dangling bond, impurity or other cause and to improve the insulating strength.

For the high performance of interface with the silicon active layer constituting the channel designated by (b) in FIG. 18, it is required to reduce the interface level derived from incomplete cleaning, plasma damage, etc.

For covering the island's stepped edges designated by (c) in FIG. 18, the island-shaped semiconductor layer has to be covered precisely.

In order to solve these problems, a method of minimizing plasma damage with improving the insulating strength by sputtering using a mixed gas of oxygen and argon as a discharge gas has been proposed by Japanese Laid-Open Publications Nos. Hei3-120871 and Hei3-241873. However, in sputtering, since the film-forming precursor strikes on the substrate at about right angles, precise covering over the stepped edges of the island is difficult to achieve.

Japanese Patent Laid-Open Publication No. Hei3-19340 discloses a method for increasing the film-forming rate gradually as the film formation progresses away from the semiconductor-and-insulating-film interface, by lowering the concentration of helium with time during plasma CVD.

Japanese Patent Laid-Open Publication No. Hei3-108319 disclosed a method for forming a good semiconductor-and-insulating-film interface by carrying out the formation of a semiconductor thin film and the formation of an insulating film in a common reaction vessel.

The above-mentioned scientific paper, i.e., IEEE ELECTRON DEVICE LETTERS, Vol. 15, No. 2, page 69, "High Performance Polycrystalline Silicon Thin Film Transistor Fabricated Using Remote Plasma CVD of $SiO_2$," by M. Sekiya, et al. Additionally discloses remote plasma CVD of silicon dioxide film formation for obtaining a good insulating-film-and-silicon interface. For forming a good semiconductor-and-insulating-film interface, plasma impact on the surface of a semiconductor, which constitutes a gate insulating film, is restricted by bringing a plasma forming region, which serves to assist film-forming reaction of the precursor and dissolution of gas, away from the substrate position.

In this conventional method, however, although a good interface can be formed, the insulating strength is yet low so that thinning of the gate insulating film in an effort to secure the necessary reliability of the device and to lower the threshold voltage would be difficult to achieve.

SUMMARY OF THE INVENTION

It is therefore an object of the present invention to provide a thin film transistor structure which increases the degree of freedom in designing the structure and in selecting the thin film materials in the manufacturing process and a method for manufacturing such thin film transistor structure and does not need a dry etching step, which requires high uniformity and reproductivity, thus realizing a thin film transistor that takes on a good MOS interface characteristic in a low-temperature process.

Another object of the invention is to provide a highly dielectric MOS structure without increasing the number of process steps and to provide, by a practical process, a thin film transistor which is operable by a low threshold voltage.

Still another object of the invention is to provide a thin film transistor which guarantees: using the chemical vapor deposition (CVD), which enables good step-coverage precision, and particularly plasma CVD rather than the physical vapor deposition, which is represented by sputtering high in directivity and not suitable in covering the stepped edges of the island, (1) lowering the defect level derived from residual stress, dangling bond, impurity, etc. and improving the insulating strength, (2) lowering the interface level derived from incomplete cleaning, plasma damage, etc., and (3) covering stepped edges of the island of semiconductor layers precisely.

A further object of the invention is to provide a method for manufacturing the thin film transistor described in the previous paragraph.

According to a first aspect of the present invention, in a thin film transistor comprising an insulator substrate, a semiconductor layer, which is formed on the insulator substrate in an island shape and is composed of channel, source and drain regions, a gate insulating film, and a gate electrode, after the gate insulating film has been formed, the gate insulating film is covered with the gate electrode from the upper side, as shown in FIGS. 1(a) to 1(c) and 2(a) to 2(c). The width of the gate insulating film at least in the B–B' direction transverse of the gate electrode is smaller than the width of the channel region. And the gate insulating film at least beneath the gate electrode is larger in thickness at the central region of the semiconductor layer than at the end regions of the semiconductor layer.

With this first transistor structure, it is possible to form a good interface between the insulating film and the silicon layer, as disclosed in IEEE ELECTRON DEVICE LETTERS, Vol. 15, No. 2, page 69, "High Performance Polycrystalline Silicon Thin Film Transistor Fabricated Using Remote Plasma CVD of $SiO_2$," by M. Sekiya, et al., and also to prevent gate leak in a simple manner without employing the step covering method disclosed in Japanese Patent Laid-Open Publication No. Hei6-85258. Namely, the stepped edges of the island-shape semiconductor layer are gentle in slope so that gate leak can be prevented there.

According to a second aspect of the invention, there is provided a thin film transistor comprising: an insulator substrate; a semiconductor layer formed on the insulator substrate in an island shape; a gate insulating film covering the semiconductor layer; and a gate electrode disposed over the gate insulating film; the gate insulating film being composed of a first gate insulating film layer, which is formed on the island of the semiconductor layer in an island shape analogous to the first-named island shape in such a manner that the first gate insulating film layer and the semiconductor layer jointly form a composite stepped island, and a second gate insulating film layer covering the composite stepped island, the first and second gate insulating film layers having different thicknesses $d^1$, $d_2$ which satisfy the following relation.

$$d^1 < d_2.$$

With this second transistor structure, it is possible to prevent gate leak with good reproductivity.

According to a third aspect of the invention, the thicknesses $d^1$, $d_2$ of the first and second gate insulating film layers and a thickness $d_{si}$ of the semiconductor layer satisfy the following relation.

$$d_{si} + d_1 < d_2.$$

Also with this third transistor structure, it is possible to prevent gate leak with good reproductivity.

According to a fourth aspect of the invention, the gate insulating film is a laminate composed of two or more kinds of layers of different materials, and the material of one layer of the laminate defining an interface with the semiconductor layer is lower in permittivity than the material of the remaining at least one layer of the laminate. With this fourth transistor structure, it is possible to obtain the same drain current as conventional without increasing voltage applied to the gate even if the second insulating film is increased in thickness. Particularly in a preferable transistor structure in which the material of the first gate insulating film layer is silicone oxide and at least one of the materials of the remaining layers of the laminate is silicone nitride, it is possible to increase the thickness of the second insulating film without lowering the performance as compared to the case when the second insulating film is silicon dioxide, thus preventing gate leak.

According to a fifth aspect of the invention, there is provided a method for manufacturing a thin film transistor, comprising the steps of: forming a thin semiconductor film on an insulator substrate whose at least one surface is of an insulator; forming a first gate insulating film on the thin semiconductor film; etching the first gate insulating film at least one direction along a prospective gate electrode of the thin film transistor transverse of the first gate insulating film, with leaving unetched through a width smaller than the width of a prospective channel, source or drain of the thin film transistor; forming a second gate insulating film covering the first gate insulating film and the thin semiconductor film; and forming the gate on the second gate insulating film. Using this method, it is possible to obtain the first-named thin film transistor.

According to a sixth aspect of the invention, there is provided a method for manufacturing a thin film transistor, comprising the steps of: forming a thin semiconductor film on an insulator substrate whose at least one surface is of an insulator; forming a first gate insulating film on the thin semiconductor film; etching the first gate insulating film and the thin semiconductor film with leaving unetched regions as prospective channel, source and drain regions of the thin film transistor; forming a second gate insulating film covering the first gate insulating film and the thin semiconductor film; and forming a gate electrode on the second insulating film; the rate of the etching of the first gate insulating film being higher than that of the thin semiconductor film.

According to a seventh aspect of the invention, laser illumination takes place after at least one of the first and second gate insulating film layers has been formed on the thin semiconductor film. Since the thin semiconductor film and part of the gate insulating film formed on it are simultaneously exposed to laser, it is possible to treat the interface between the semiconductor and the insulating film with the heat generated due to laser absorption into the interface, thus forming the interface in a proper shape.

According to an eighth aspect of the invention, there is provided a thin film transistor comprising: an insulator substrate; a silicon active layer formed on the insulator substrate in an island shape; a gate insulating film covering the silicon active layer; and a gate electrode disposed over the gate insulating film; the gate insulating film being a silicon dioxide film containing at least two kinds of inert gas atoms different in mass number, the inert gas atoms smaller in mass number being contained in and near a first interface between the silicon dioxide silicon film and the silicon active layer, the inert gas atoms larger in mass number being contained in and near a second interface between the silicon dioxide film and the gate electrode.

In the present invention, the silicon active layer is a crystalline silicon layer from which prospective channel, source and drain regions of the thin film transistor are to be formed.

According to a ninth aspect of the invention, the gate insulating film of the thin film transistor can be obtained by a method for forming a silicon dioxide film on a silicon active layer of an insulator substrate by CVD, using a mixed gas containing a silicon compound, oxygen and a carrier gas, wherein the carrier gas comprises two or more kinds of inert gases, and the inert gas smaller (preferably smallest) in mass number is used at a starting stage of the silicon dioxide film formation while the inert gas larger than that smallest (or smaller) in mass number at a final stage of the silicon dioxide film formation. As CVD, particularly plasma CVD is preferable.

In this method, the stepped edges of the island can be covered with the insulating film precisely using CVD. Even assuming that plasma CVD is employed, since the impact is limited to light atoms or ions during formation of the insulating film near the interface with the silicon active layer, occurrence of plasma damage is reduced to a minimum, thus obtaining a high-performance of the interface. By supplying atoms or ions, which are larger in mass and hence have energy, to the surface of the growth during formation of the insulating film near the interface with the gate electrode, it is possible to increase the density of the insulating film by the particle impact, thus securing an excellent insulating strength. Accordingly the state of the interface with the silicon active layer is good and the resulting thin film transistor can take on the superb insulating strength.

According to a tenth aspect of the invention, the silicon dioxide film is a laminate composed of two or more layers, at least one of the layers contiguous to the silicon active layer containing the active gas atoms smallest in mass number, at least one of the remaining layers contiguous to the gate electrode containing the inert gas atoms larger in mass number than the inert gas atoms smallest in mass number. During formation of this silicon dioxide film, the kind of inert gas to be supplied may be changed with another, or the inert gas larger in mass number may be supplied in addition to the previous inert gas being supplied.

According to a eleventh aspect of the invention, the inert gas atoms smallest in mass number are contained in and near the first interface between the silicon dioxide film and the silicon active layer, and the active gas atoms larger in mass number than those smallest in mass number are contained in the silicon dioxide film in varying concentration continuously increasing from the first interface with the silicon active layer toward the second interface with the gate electrode. During formation of this silicon dioxide film, the amount of supply of the inert gas larger in mass number than those smallest in mass number may be progressively increased.

Most preferably, the inert gas atoms smallest in mass number are helium, and the inert gas atoms larger in mass number than helium are argon.

According to a twelfth aspect of the invention, there is provided a method for manufacturing a thin film transistor, comprising the steps of: forming a silicon active layer on a substrate whose at least top surface is an insulator; forming a first silicon dioxide layer on a top surface of the silicon active layer by CVD using a mixed gas containing a silicon compound, oxygen and a first inert gas as a carrier gas; etching the silicon active layer and the first silicon dioxide layer simultaneously in such a manner that regions of the silicon active layer, which are adapted to be prospective channel, source and drain regions of the thin film transistor, are left unetched and that the first silicon dioxide layer becomes smaller than each of the channel, source and drain regions; and forming a second silicon dioxide layer, which covers the first silicon dioxide layer and the silicon active layer, by CVD using a mixed gas containing a silicon compound, oxygen and a second active gas, which is larger in mass number than the first active gas, as a carrier gas.

According to this method, it is possible to secure a good interface performance with the silicon active layer by the first silicon dioxide film and to improve the insulation strength by the precisely formed second silicon dioxide layer, so that the peripheral edge of the island of the first silicon dioxide layer and silicon active layer can be covered with the second silicon dioxide layer very simply.

BRIEF DESCRIPTION OF THE DRAWINGS

The above and other objects, advantages and features of the present invention will be more apparent from the following description taken in conjunction with the accompanying drawings in which:

FIGS. 5(a) to 5(j) are diagrams showing another thin film transistor manufacturing method according to the first embodiment;

FIGS. 9(a) to 9(c) are diagrams showing a conventional example; and

FIGS. 11(a) to 11(c) are diagrams showing still another conventional example.

FIGS. 17(a) to 17(j) are diagrams showing a thin film transistor manufacturing method according to the invention.

BRIEF DESCRIPTION OF THE PREFERRED EMBODIMENTS

The principles of the present invention are particularly useful when applied to a thin film transistor and its fabrication process, various embodiments and examples of which will now be described in detail with reference to the accompanying drawings.

Embodiment 1

Figure 1:
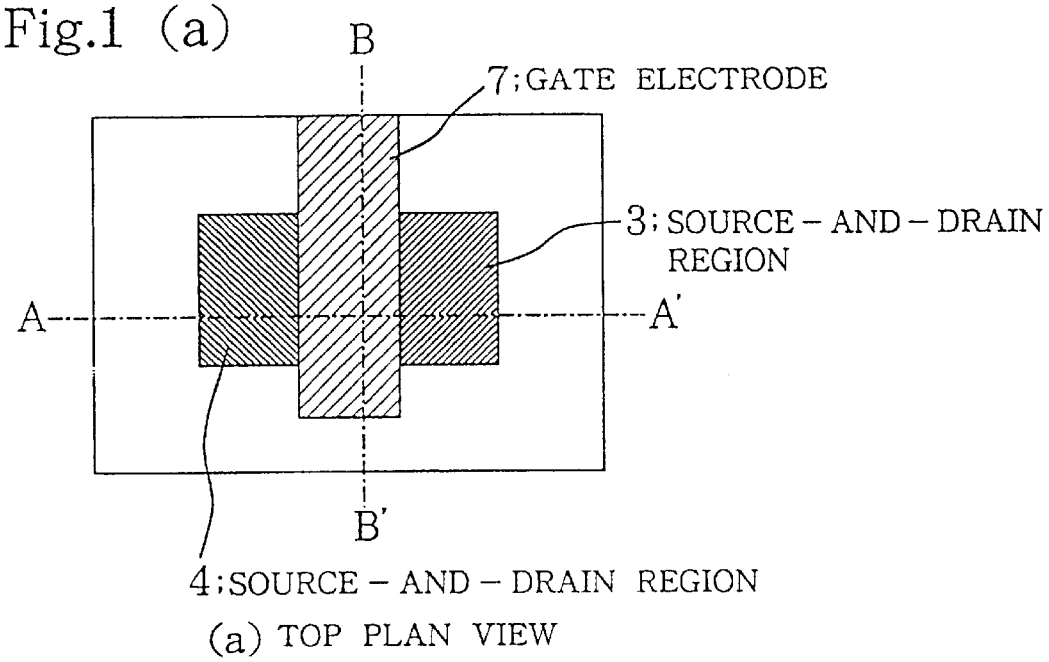
FIGS. 1(a) to 1(c) are diagrams showing a thin film transistor according to a first embodiment of the present invention.
Figure 1:
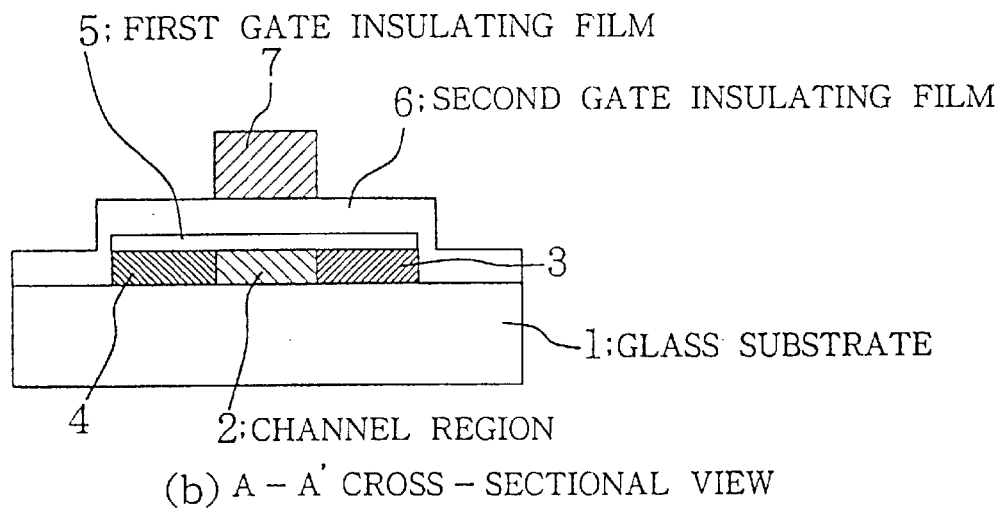
Figure 1:
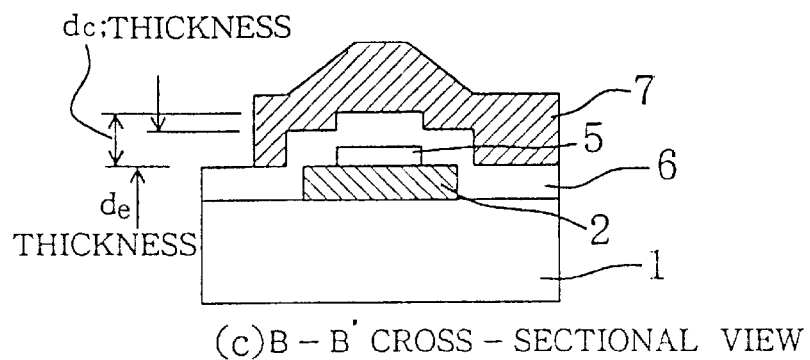

FIG. 1(a) is a top plan view of a thin film transistor according to a first embodiment of the invention, FIG. 1(b) is a cross-sectional view taken alone line A–A' of FIG. 1(a), and FIG. 1(c) is a cross-sectional view taken alone line B–B' of FIG. 1(a). The thin film transistor of FIGS. 1(a) to 1(c) comprises a glass substrate 1 as an insulator, and a silicon layer composed of a source-and-drain region 4, 3, and a channel region 2 and formed on the glass substrate 1 in an island shape. A first gate insulating film 5, which is formed on the island of the silicon layer, has a first width equal to the width of the silicon layer in the source-drain direction, i.e., the A–A' direction and a second width smaller than the width of the silicon layer in the gate electrode direction, i.e., in the B–B' direction. In the gate electrode direction, a below-described gate electrode extends across the first-gate insulating film 5. These regions of the silicon layer and the first gate insulating film 5 are covered by a second gate insulating film 6, on which a gate electrode (hereinafter also called simply the gate) 7 is formed. In the resulting structure, as shown in FIG. 1(*c*), a first thickness dc of the silicon layer at its central region is larger than a second thickness de of the silicon layer at its either end region, and the island of the silicon layer gently slopes down to its opposite ends so that the silicon layer island can be covered with the second gate insulating film 6 without any leak current between the gate 7 and the silicon layer.

The material for the first and second gate insulating films is exemplified by silicon dioxide, silicon nitride, aluminum oxide and tantalum oxide. Preferably, silicon dioxide is used for the first gate insulating film and silicon nitride is used for the second gate insulating film. Because it is a common knowledge that for the interface between the silicon layer and the gate insulating film, the silicon dioxide is superior to the other materials and that silicon nitride is higher in permittivity than silicon dioxide and can hence gain a desired MOS capacitance without thinning the gate insulating film down to a minimum and, as a result, the threshold value in operating the thin film transistor can be reduced.

In the thin film transistor of the present invention, the side surfaces, in cross-sectional shape, of the silicon channel region or of the first gate insulating film may be at an angle smaller than 90 degrees with respect to the substrate surface; this is, the silicon channel region or the first gate insulating film may be tapered.

The fabrication process of this thin film transistor will now be described with reference to FIGS. 5(*a*) to 5(*j*).

FIGS. 5(*a*) to 5(*g*) are process diagrams as cross-sectional views taken along line A–A' of FIG. 1(*a*), and FIGS. 5(*h*) to 5(*j*) are process diagrams as cross-sectional views taken along line B–B' of FIG. 1(*a*). An amorphous silicon film 502 is deposited by a thickness of 50 nm on the glass substrate 1 (preferably coated with a silicon oxide film or silicon nitride film formed by CVD or sputtering) by low pressure CVD, whereupon a silicon dioxide film 503 is deposited by a thickness of 20 nm over the amorphous silicon film 502. Then a polysilicon film is formed by illuminating KrF excimer laser through the silicon dioxide film 503. Alternatively the polysilicon film may be formed by illuminating XeCl or XeF excimer laser or YAG laser. Then a structure shown in FIGS. 5(*d*) and 5(*h*) is formed by photolithography and etching twice. Specifically, a resist pattern for obtaining a desired shape of silicon dioxide film is formed and the silicon dioxide pattern is patterned. At that time, etching is performed by flowing etching gases $CF_4$ and $CHF_3$ by 10 sccm (standard cubic centimeter per minute) and 40 sccm, respectively, under a condition that a making electricity is 400 W and a gas pressure is 6 Pa, using a parallel-plate-type RF plasma etching apparatus. Under this condition, the etching rate of the silicon dioxide film is more than twenty times that of the polysilicon, so only the silicon dioxide film can be selectively etched. Then a resist pattern for obtaining a desired shape of polysilicon film is formed, whereupon dry etching takes place again. As a result, the structure of FIGS. 5(*d*) and 5(*h*) is obtained. During the etching of the polysilicon film, etching is performed by flowing $CF_4$ and oxygen by 142 sccm and 7 sccm, respectively, under a condition that a gas pressure is 20 Pa and a making electricity is 300 W. Under this condition, a selective ratio of 10 or higher for the silicon dioxide film as the upper element and the glass substrate as the lower element can be realized.

Again an 80-nm-thick silicon dioxide film 504 is obtained and an $Al/n^+Si$ film (505) as a prospective gate electrode are formed. Until this stage, the structure of FIGS. 1(*a*) to 1(*c*) is obtained. After that, accompanying the patterning of the gate electrode, the gate insulating film is removed to expose the silicon layer, and ions of a desired impurity such as phosphorus or boron are implanted in self-alignment. As means of impurity implantation, the ion doping method may be used in which hydrogen is implanted simultaneously with the implanting of the impurity, without causing mass separation. Activation of impurity may be performed by illuminating laser again or by heat treatment at about 600 C. Further, an interlayer insulating film 506 and contact holes are formed and a gate electrode 507 is formed of Al.

During pulse laser illumination, as a thin silicon film is encountered with melting and recrystallization, the same attention as the ordinary semiconductor fabrication process must be taken to the impurity. By performing the laser crystallization after an interface of the silicon film and insulating film has been formed, crystallization is possible with keeping the interface clean. Alternatively, laser crystallization may be performed after a silicon dioxide layer has been formed in an upper part of the silicon film, so that a uniform thin polycrystalline film in which particles are uniform in size can be obtained as both the substrate interface and silicon dioxide interface act as a nucleus forming site during crystallization. This effect is useful in obtaining a thin polysilicon film in which change of particle size is small with respect to the change of laser illumination intensity.

Embodiment 2

Figure 2:
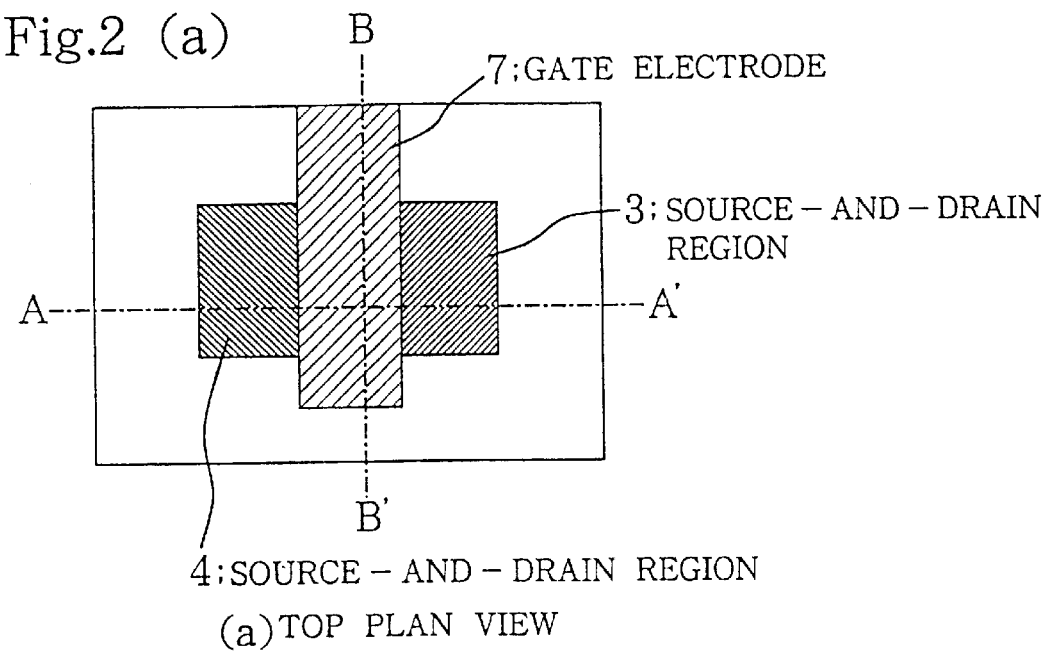
FIGS. 2(a) to 2(c) are diagrams showing another thin film transistor according to a second embodiment of the invention.
Figure 2:
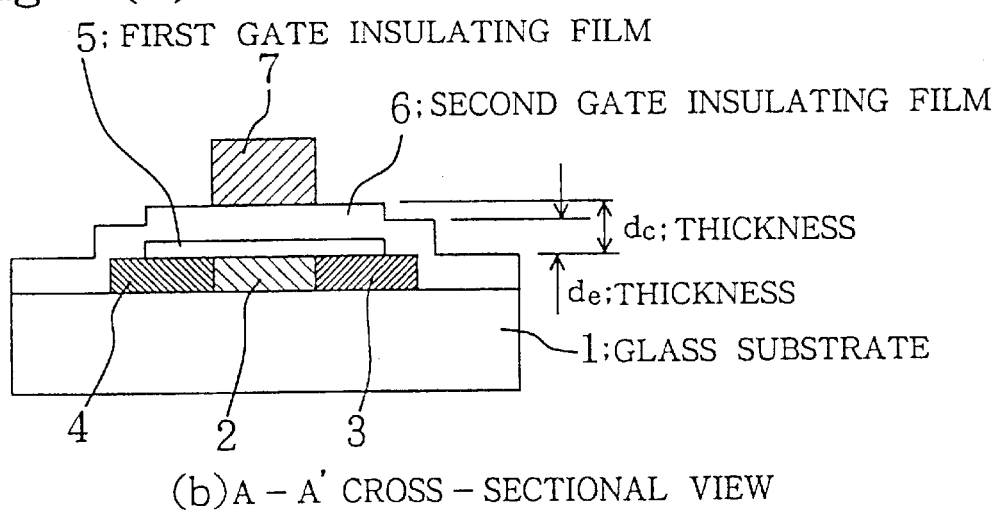
Figure 2:
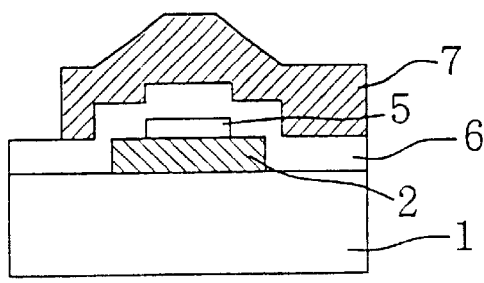

FIG. 2(*a*) is a top plan view of a thin film transistor according to a second embodiment of the present invention, FIG. 2(*b*) is a cross-sectional view taken alone line A–A' of FIG. 2(*a*), and FIG. 2(*c*) is a cross-sectional view taken alone line B–B' of FIG. 2(*a*). The thin film transistor of FIGS. 2(*a*) to 2(*c*) comprises a glass substrate 1 as an insulator, a silicon layer, which is composed of a source-and-drain region 4, 3 and a channel region 2 and formed on the glass substrate 1 in an island shape, a first gate insulating film 5, a second gate insulating film 6, and a gate electrode (hereinafter also called the gate) 7. Because the channel region 2, the gate insulating films 5, 6 and the gate 7 constitute the so-called metal-insulator-semiconductor structure, it is possible control a drain current by controlling a voltage applied to the gate 7. The material for the first and second gate insulating films 5, 6 is exemplified by silicon dioxide, silicon nitride, aluminum oxide and tantalum oxide. As shown in FIGS. 2(*b*) and 2(*c*), by reducing the first gate insulating film 5 in width and length as compared to the silicon channel region 2 and forming the second gate insulating film 6 over the first gate insulating film 5, it is possible to obtain a thin film transistor in which a first thickness de of the gate insulating film above and near the end regions of the island of the silicon layer and a second thickness dc of the gate insulating film above and near the central region of the island of the silicon layer, i.e., the channel of the thin film transistor satisfy the following relation.

$$d_e < d_c.$$

The structure of FIGS. 2(*b*) and 2(*c*) in which the first gate insulating film is smaller in width and length than the silicon channel region may be obtained by an alternative method as follows. On the glass substrate 1 as the insulator, the silicon layer, which is composed of the source, drain and channel regions 4, 3, 2, and the first gate insulating film 5 are deposited; in order to obtain a desired size of silicon layer, a resist pattern is formed by photolithography. Then the island-shape laminate of the silicon layer and the insulating film reflected from the resist pattern is obtained by etching. At that time, by selecting the following condition.

(etching rate of silicon layer)<(etching rate of gate insulating film)

a structure in which the first gate insulating film is smaller in width and length than the silicon channel region can be realized.

The fabrication process of this thin film transistor will now be described with reference to FIGS. 6(a) to 6(j). FIGS. 6(a) to 6(g) are process diagrams as cross-sectional views taken along line A–A' of FIG. 2(a), and FIGS. 6(h) to 6(j) are process diagrams as cross-sectional views taken along line B–B' of FIG. 2(a). An amorphous silicon film is deposited by a thickness of 75 nm on the glass substrate 1 (preferably coated with a silicon oxide film or silicon nitride film formed by CVD or sputtering) by low pressure CVD, whereupon a polysilicon film 502 is formed by illuminating KrF excimer laser through the amorphous silicon film. Alternatively the polysilicon film may be formed by illuminating XeCl or XeF excimer laser or by solid phase epitaxy. It is a common knowledge in the art that as the polysilicon thin film is formed by a laser crystallization process, its surface becomes much bumpy depending on the laser illumination intensity condition during laser crystallization. In order to prove advantageous results of the present invention with reference to those of the conventional art, laser crystallization took place by the laser illumination intensity ranging from 150 to 350 mJ/cm$^2$ under a low illumination intensity condition, namely, a condition such that the polysilicon thin film surface would become less bumpy and no gate leak from that surface would occur. Then a silicon dioxide film 503 is deposited on the polysilicon film 502 by a thickness of 10 nm. Then a structure shown in FIG. 17(d) is formed by photolithography and etching. At that time, etching is performed by flowing by flowing etching gases CF$_4$ and CHF$_3$ individually by 25 sccm under a condition that a making electricity is 400 W and a gas pressure is 6 Pa, using a parallel-plate-type RF plasma etching apparatus. Under this condition, the etching rate of the silicon dioxide film varies with respect to that of the silicon layer due to the partial pressure of CF4. In this embodiment, the etching rate ratio is SiO$_2$/Si=5/1. Again a silicon dioxide film 504 is formed by a thickness of 30 nm and an Al/n$^+$Si film (505) is formed over the silicon dioxide film 504 as the gate electrode. Until this stage, the structure shown in FIGS. 2(a) to 2(c) is obtained. After that, accompanying the patterning of the gate electrode, the gate insulating film is removed to expose the silicon layer, and ions of a desired impurity such as phosphorus or boron are implanted in self-alignment. As means of impurity implantation, the ion doping method may be used in which hydrogen is implanted simultaneously with the implanting of the impurity, without causing mass separation. Activation of impurity may be performed by illuminating laser again or by heat treatment at about 600° C. Further, an interlayer insulating film 506 and contact holes are formed and gate interconnection 507 is formed of Al.

Figure 7:
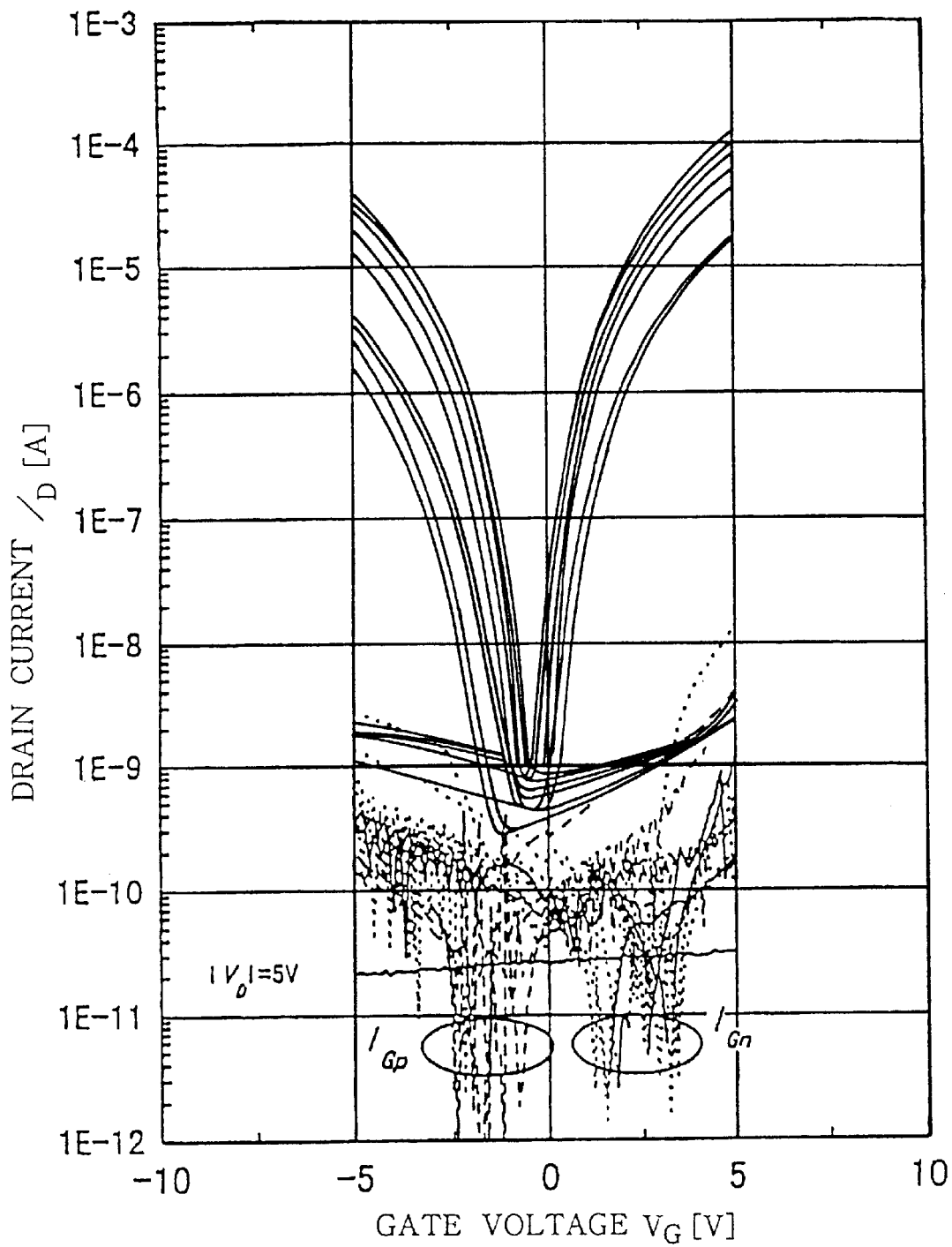
FIG. 7 is a V-I characteristic graph showing the characteristic of gate voltage vs. drain current of the thin film transistor of the second embodiment.
Figure 8:
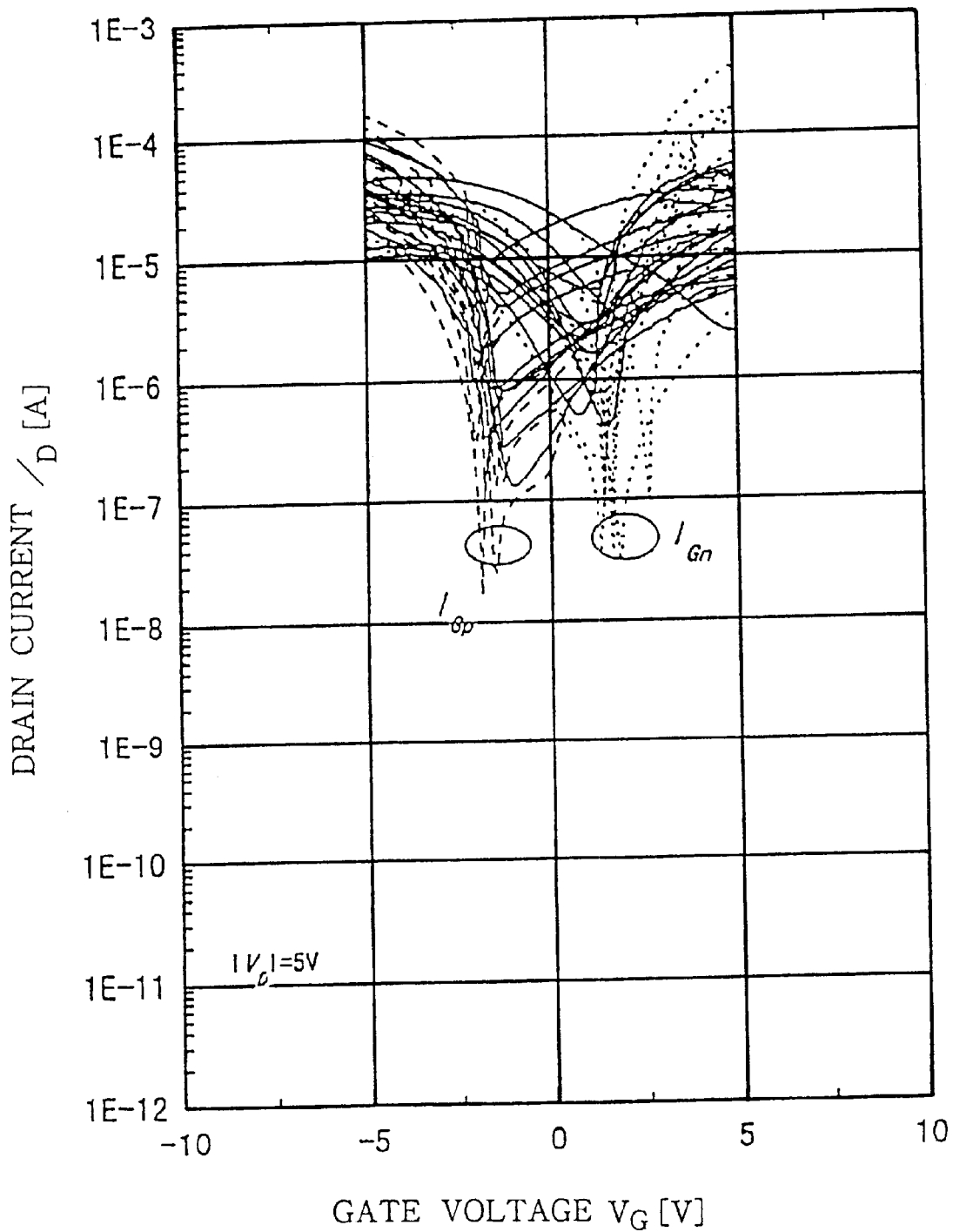
FIG. 8 is a V-I characteristic graph showing the characteristic of gate voltage vs. drain current of a conventional thin film transistor.
Figure 10:
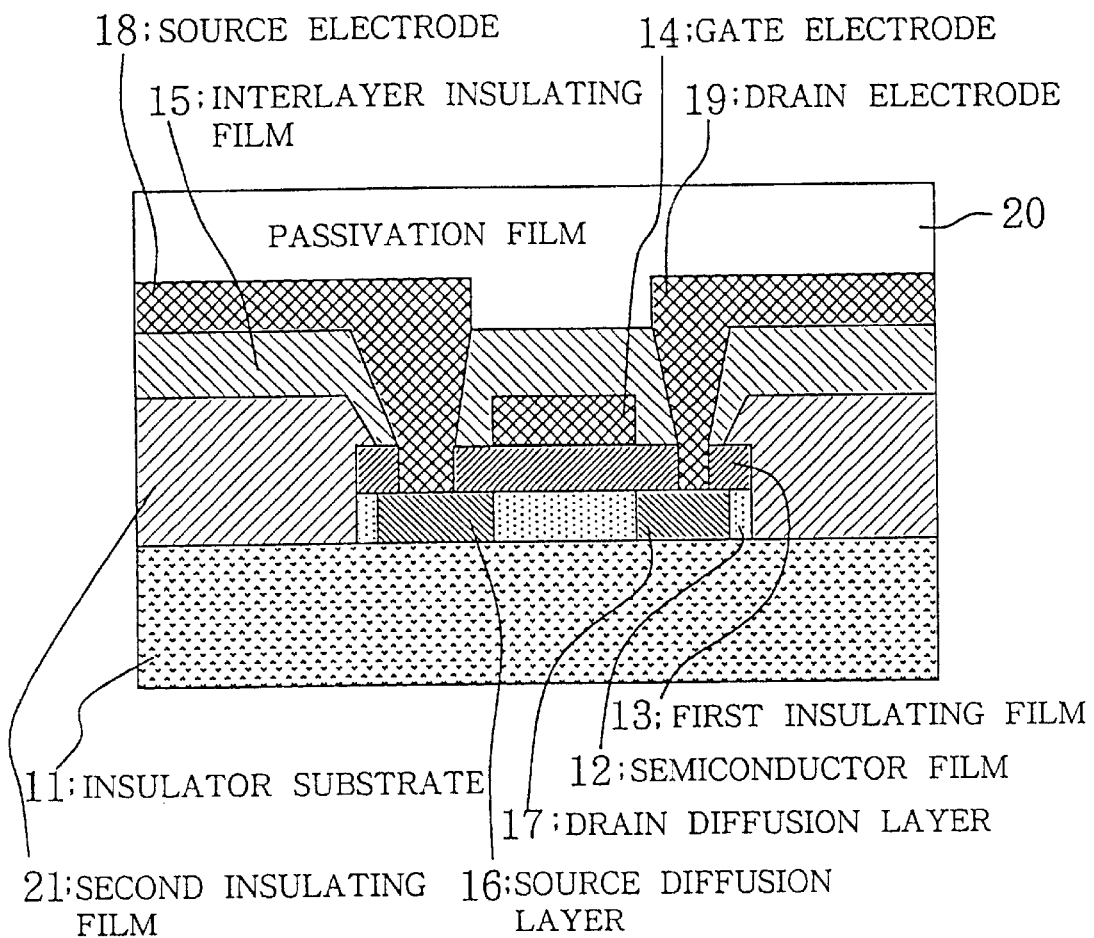
FIG. 10 is a diagram showing another conventional example.

By this fabrication process, a thin film transistor which satisfies the relation the channel length/width=10/10 μm was manufactured. The thickness of the silicone layer is 75 nm; the channel width, 10 μm; the thickness and width of the silicon dioxide film as the first insulating film, 10 nm and 8 μm, respectively; the thickness of the silicon dioxide film as the second insulating film, 30 nm. Accordingly, in this thin film transistor, the first thickness of the gate insulating film above and near the end regions of the island of the silicon layer, which include the channel region disposed in a direction from the source region to the drain region, is 30 nm (=d$_s$) and the second thickness of the gate insulating film above and near the central region of the island of the silicon layer is 40 nm (=d$_c$). The V-I characteristic of gate voltage vs. drain current at that time is shown in FIG. 7. Whereas in a thin film transistor manufactured by the conventional method (channel length/width=10/10 μm; the silicon layer thickness is 75 nm; the channel width, 10 μm; the thickness and width of the silicon dioxide layer as the first insulating film, 10 μm and 10 μm, respectively; the thickness of the silicon dioxide film as the second insulating film, 30 μm), a V-I characteristic of gate voltage vs. drain current was obtained as shown in FIG. 8. In FIGS. 7 and 8, solid lines represent the V-I characteristic of gate voltage vs. drain current of n-channel TFT and p-channel TFT; dotted lines, the gate leak current of n-channel TFT; dashed lines, the gate leak current of p-channel TFT. As is apparent from FIGS. 7 and 8, in the structure of the present invention the gate leak current is controlled, so the structure takes on an excellent transistor characteristic. Furthermore, as is already described, in order to prove the advantageous results of the present invention with reference to those of the conventional art, laser illumination took place by the laser illumination intensity ranging from 150 to 350 mJ/cm$^2$ under a low illumination intensity condition, namely, a condition such that the polysilicon thin film surface would become less bumpy and no gate leak current from that surface would occur. The illustrated TFT characteristic fluctuates in accordance with the laser illumination intensity. In FIGS. 7 and 8, the difference in leak current is remarkable not due to the laser illumination intensity, and so the advantageous results of the present invention were proved.

In this embodiment, etching is performed by a parallel-plate-type RF plasma etching apparatus under a condition that the etching rate ratio is SiO$_2$/Si=5/1. Alternatively, any other etching process may be used as long as the relation (the etching rate of the first gate insulating)>(the etching rate of the semiconductor thin film) is satisfied.

Embodiment 3

Figure 3:
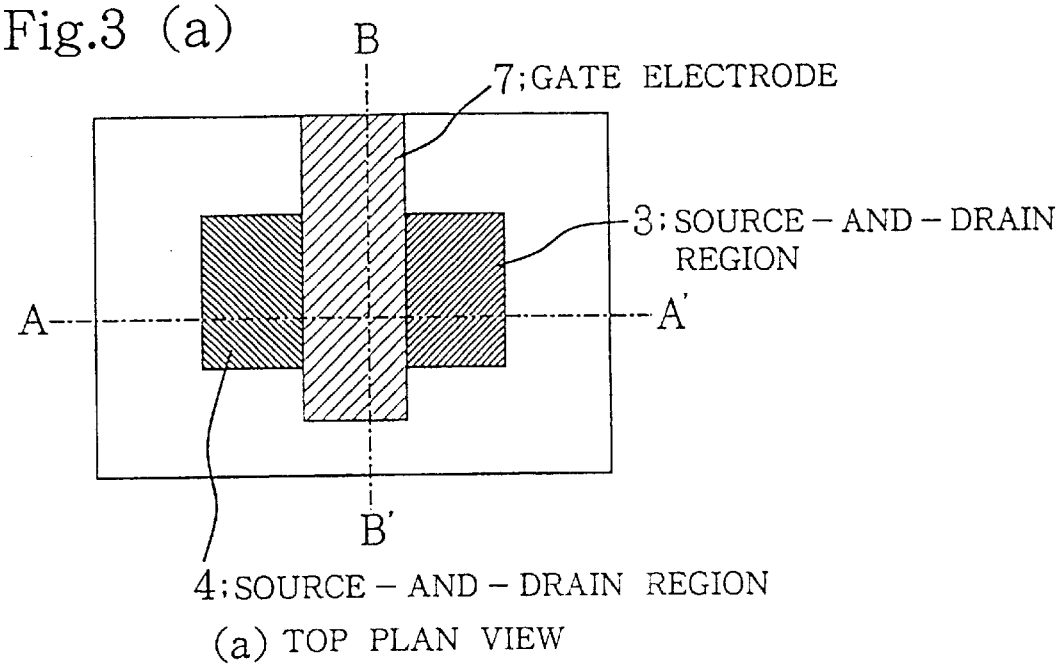
FIGS. 3(a) to 3(c) are diagrams showing still another thin film transistor according to a third embodiment of the invention.
Figure 3:
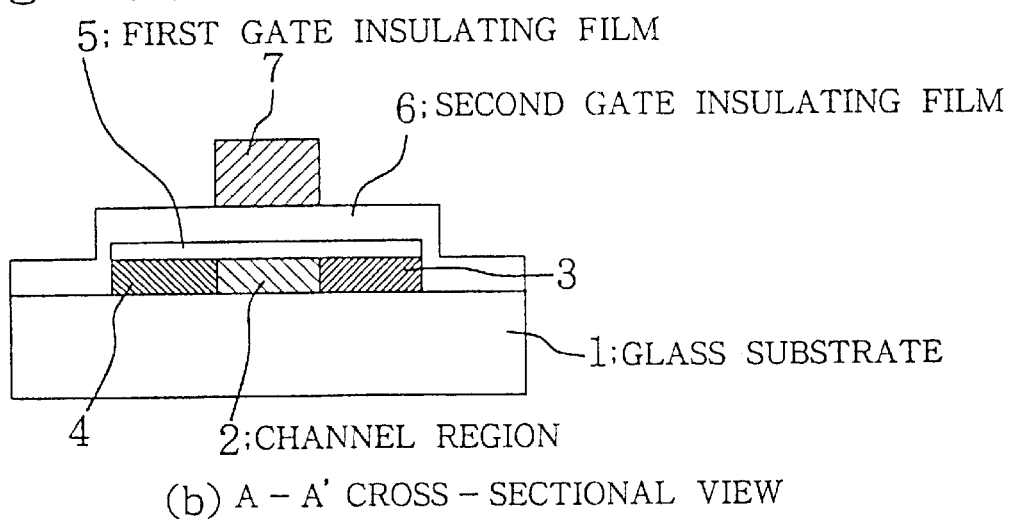
Figure 3:
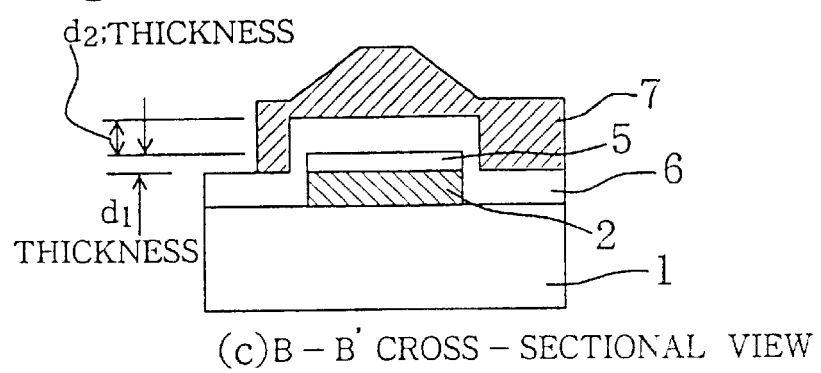

FIG. 3(a) is a top plan view of a thin film transistor according to a third embodiment of the present invention, FIG. 3(b) is a cross-sectional view taken alone line A–A' of FIG. 3(a), and FIG. 3(c) is a cross-sectional view taken alone line B–B' of FIG. 3(a). The thin film transistor of FIGS. 3(a) to 3(c) comprises a glass substrate 1 as an insulator, a silicon layer, which is composed of a source-and-drain region 4, 3 and a channel region 2 and formed on the glass substrate 1 in an island shape, a first gate insulating film 5, a second gate insulating film 6, and a gate electrode 7. Because the channel region 2, the gate insulating films 5, 6 and the gate 7 constitute the so-called metal-insulator-semiconductor structure, it is possible control a drain current by controlling a voltage applied to the gate 7. The material for the first and second gate insulating films 5, 6 is exemplified by silicon dioxide, silicon nitride, aluminum oxide and tantalum oxide. As shown in FIG. 3(c), the thickness d$_1$ of the first the first gate insulating film 5 is larger than the thickness d$_2$ of the second gate insulating film 6. With this structure, a stepped island edge of the silicon layer, which forms the channel region, and the first gate insulating film can be covered with high reliability. According to this embodiment, as shown in FIG. 3(b), in the fabrication process of the thin film transistor, though the insulating film layer existing at the region left uncovered with the gate is eliminated, this is not away from the gist of the present invention.

Embodiment 4

Figure 4:
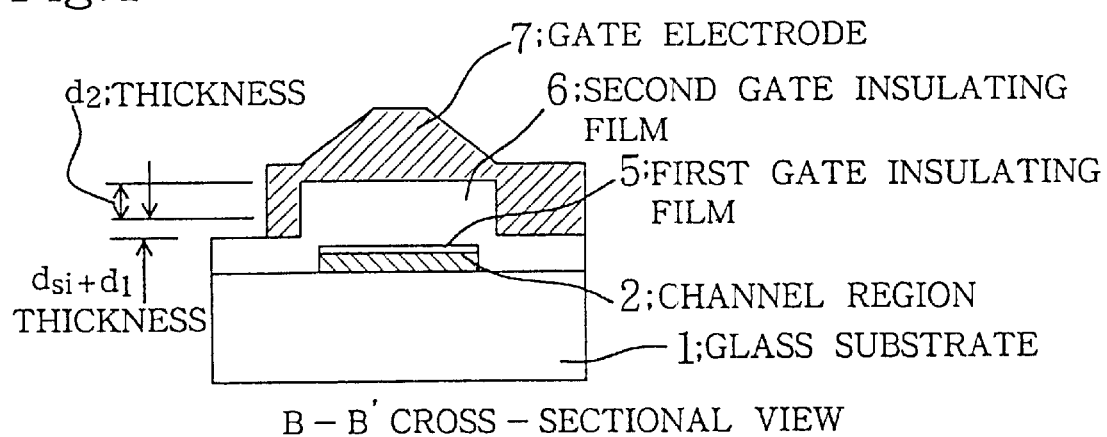
FIG. 4 is a diagram showing a further thin film transistor according to a fourth embodiment of the invention.
Figure 6:
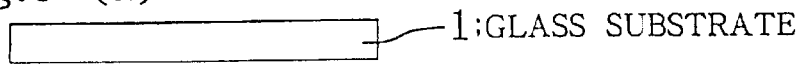
FIGS. 6(a) to 6(j) are diagrams showing a thin film transistor manufacturing method according to the second embodiment.
Figure 6:
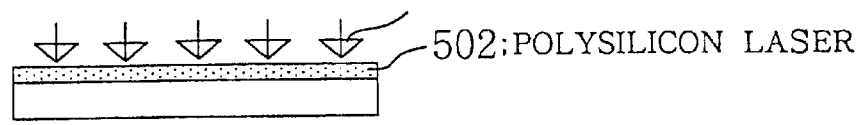
Figure 6:
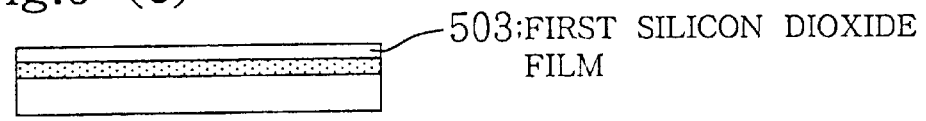
Figure 6:
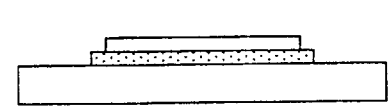
Figure 6:
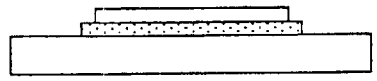
Figure 6:
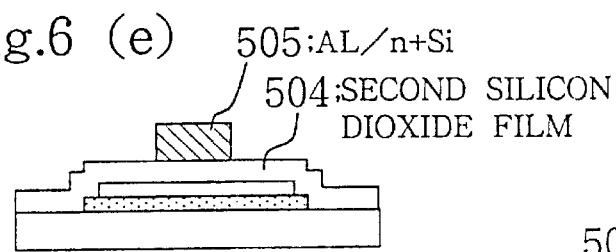
Figure 6:
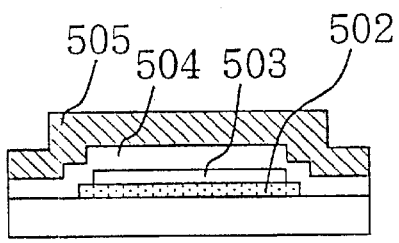
Figure 6:
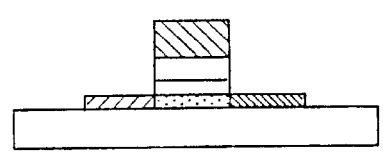
Figure 6:
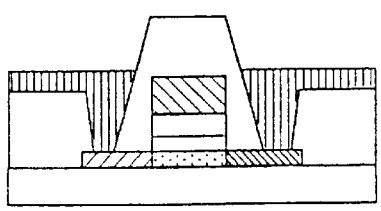
Figure 6:
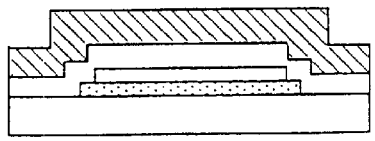

FIG. 4 is a cross-sectional view showing a thin film transistor according to a fourth embodiment of the invention. The thin film transistor of FIG. 4 comprises a glass substrate 1 as an insulator, a silicon layer, which is composed of a source-and-drain region and a channel region 2 and formed on the glass substrate 1 in an island shape, a first gate insulating film 5, a second gate insulating film 6, and a gate electrode 7. Because the thickness dsi of the silicon layer, the thickness $d_1$ of the first gate insulating film 5 and the thickness $d_2$ of the second gate insulating film 6 satisfy the following relation.

$$d_{si}+d_1<d_2,$$

it is possible to prevent any leak current, which might have occur due to the stepped island edges of the silicon layer and the gate insulating film. Further, this structure is particularly useful if the laminate is composed of two or more materials having different permittivities; in order to obtain the same MOS capacitance using high-permittivity materials, it is necessary to increase the thickness of the insulating film. Namely, using high-permittivity materials, a desired MOS capacitance can be obtained without thinning the gate insulating film to a minimum and, as a result, the threshold value in operating the thin film transistor can be reduced.

According to the present invention, since a good interface between the silicon layer and the gate insulating film is formed at a relative low temperature of about 300°, it is possible to prevent any gate leak and any breakage of the gate, thus guaranteeing a reliable high-performance thin film transistor.

Furthermore, according to the manufacturing method of the present invention, it is possible to increase the degree of freedom in material selection and fabrication process so that a high-performance thin film transistor can be obtained simply.

Embodiment 5

Figure 12:
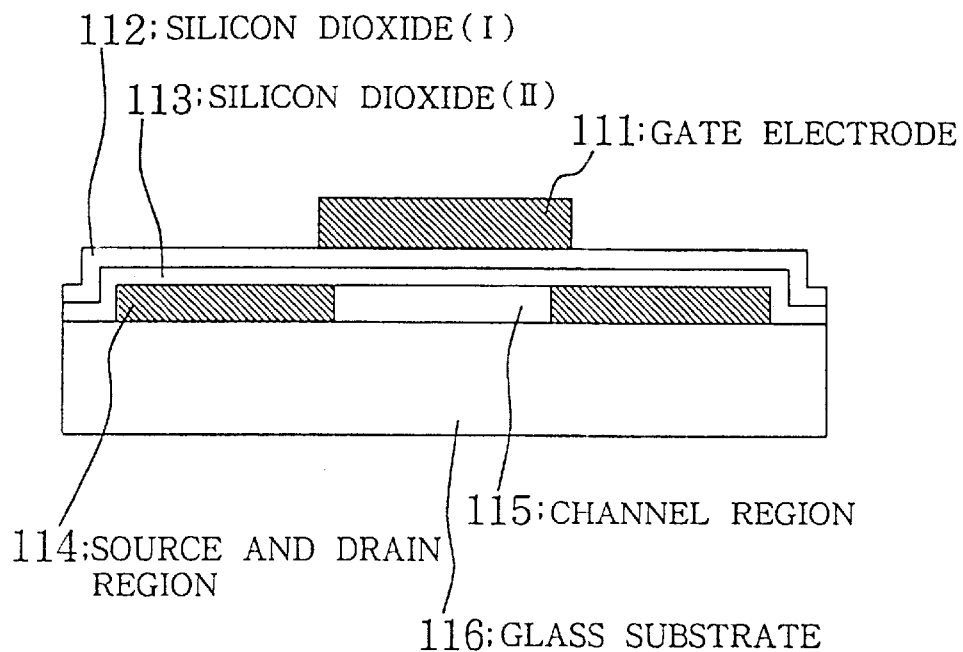
FIG. 12 is a diagram showing a thin film transistor according to a fifth embodiment of the present invention.

FIG. 12 shows a cross-sectional structure of a thin film transistor according to a fifth embodiment. This thin film transistor comprises a glass substrate 116, and a silicon active layer composed of a source-and-drain region 14 and a channel region 115 and formed on the glass substrate 116. As a gate insulating film, a silicon dioxide film (I) 112 and a silicon dioxide film (II) 113 are formed over the silicon active layer. Over the gate insulating film a gate electrode 111 is disposed.

Figure 13:
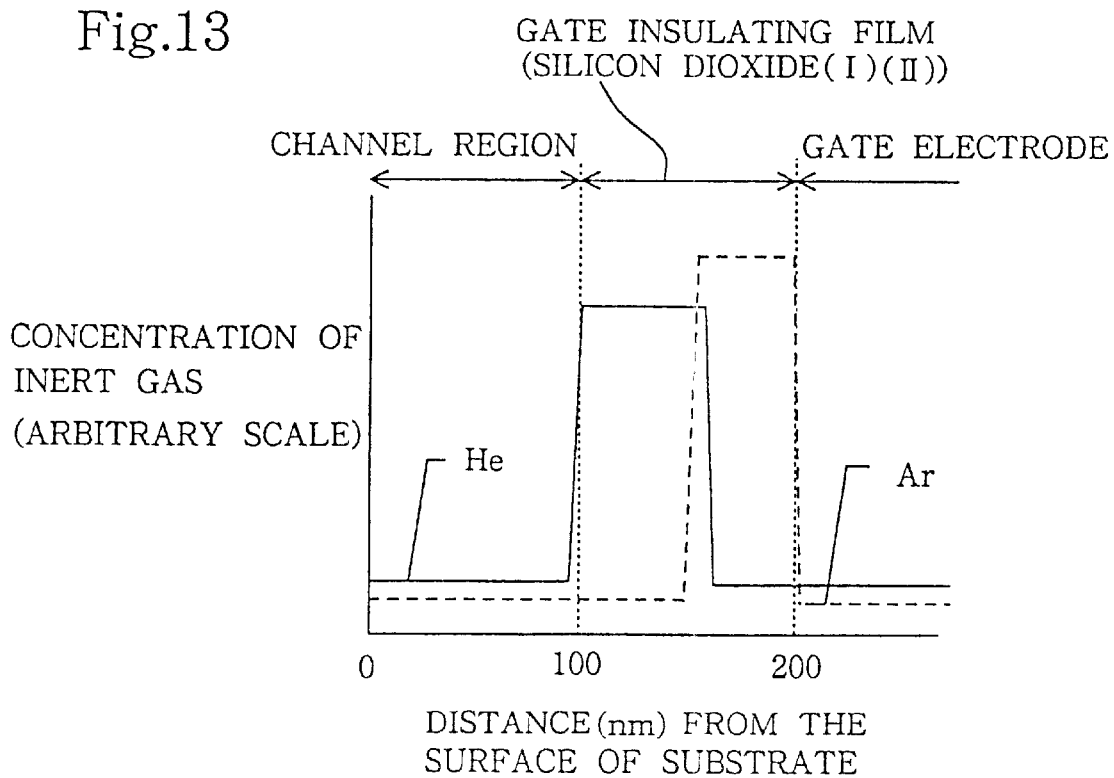
FIG. 13 is a graph showing concentrations of silicon dioxide film layers of the thin film transistor of the fifth embodiment.

Inert gases contained in the gate insulating film are different in concentration between the silicon dioxide film (I) 112 and the silicon dioxide film (II) 113 as shown in FIG. 13. In the silicon dioxide film (I) 112 contiguous to the channel region 115 of the silicon active layer, concentration of He (helium) is high, while in the silicon dioxide film (II) 113 disposed above the channel region 115, the concentration of Ar (argon) larger in mass number than He is high.

This thin film transistor structure can be manufactured in the following fabrication process. Firstly an a-Si thin film is formed on a well-cleaned glass substrate by a thickness of 100 nm by low pressure CVD. Then the a-Si thin film is exposed to XeCl excimer laser of 308 nm wavelength to form a polysilicon thin film having a desired crystallalinity. Although the intensity and number of times for such laser illumination may be chosen as desired, it is preferable that laser of about 400 mJ/cm² intensity, which enables adequate crystallization without causing film abrasion, is radiated by about 5 shots per cite.

After the polysilicon thin film has been formed on the glass substrate, a mask is formed over the polysilicon thin film by lithography using a photoresist, and the unmasked regions for prospective source and drain regions of a thin film transistor are doped with phosphorus or boron by ion implantation. Instead of ion implantation, the ion doping method in which phosphorus or boron hydride is doped without mass separation may be used. After dopant ions have thus been implanted, the source and drain regions are treated by heating at 600° for about 10 hours to activate the impurity, thus reducing the resistance of such regions.

Then the channel and source-and-drain regions of the thin film transistor are patterned in an island shape by photolithography and dry etching.

Subsequently the resulting transistor structure is well cleaned to remove off the naturally oxidized film existing on its surface, whereupon a silicon dioxide film (I) and a silicon dioxide film (II) are formed continuously by plasma CVD.

In formation of the silicon dioxide film (I), silane ($SiH_4$) and oxygen ($O_2$) were as a material gas and additionally He (helium) was used as a carrier gas for silane and oxygen. And in formation of the silicon dioxide film (II), silane ($SiH_4$) and oxygen ($O_2$) were used as a material gas likewise the silicon dioxide film (II) and additionally Ar (argon) was used as a carrier gas for silane and oxygen.

Figure 16:
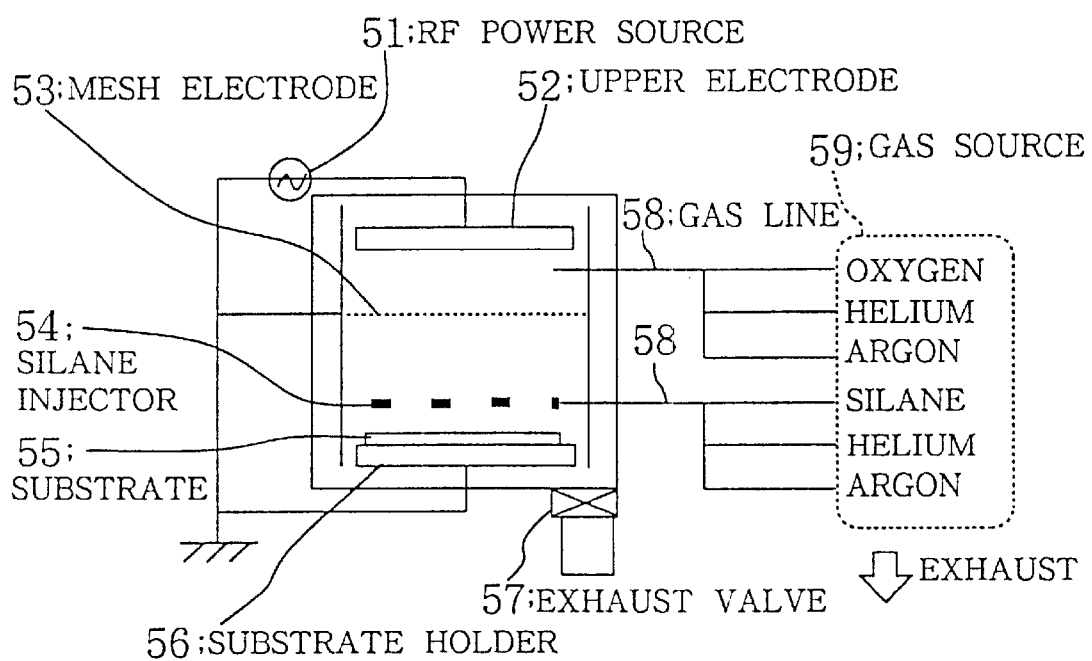
FIG. 16 is a diagram showing an apparatus to be used for forming a gate insulating film according to the fifth and sixth embodiments.
Figure 18:
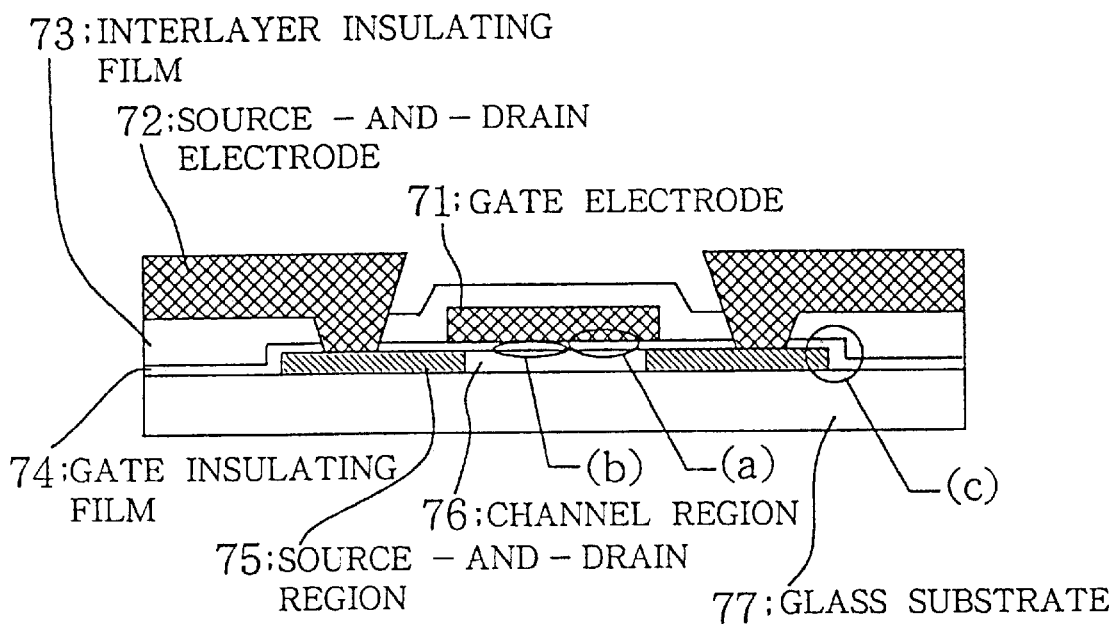
FIG. 18 is a diagram showing a conventional thin film transistor.

A plasma CVD apparatus to be used in formation of the silicon dioxide films (I), (II) is shown in FIG. 16. This plasma CVD comprises an RF power source 51, an upper electrode 52, a mesh electrode 53, a silane injector 54, a substrate holder 56, an exhaust valve 57 and a gas line 58; with the substrate 55 supported on the substrate holder 56, the film formation is carried out. From a gas source 59, silane and oxygen are supplied as the material gas and additionally He and Ar are supplied as the carrier gas. This apparatus has a mechanism capable of depositing the silicon dioxide film (I) using He as the carrier gas for silane and oxygen and of subsequently changing the carrier gas from He to Ar.

Plasmatic discharge of oxygen is generated between the upper electrode 52 and the mesh electrode 53 as active oxygen radical and inert gas radical are supplied to the substrate surface through the mesh electrode 53 to react with silane gas, thereby forming a silicon dioxide film. At that time, by biasing the mesh electrode 53, it is possible to control the supply of charged ions in plasma to the substrate. It is also possible to independently change the carrier gas for oxygen and silane.

In this embodiment, the carrier gas is changed from He to Ar. Alternatively, with the carrier gas for silane left unchanged employing He, only the carrier gas for oxygen may be changed from He to Ar with the same result.

Embodiment 6

Figure 14:
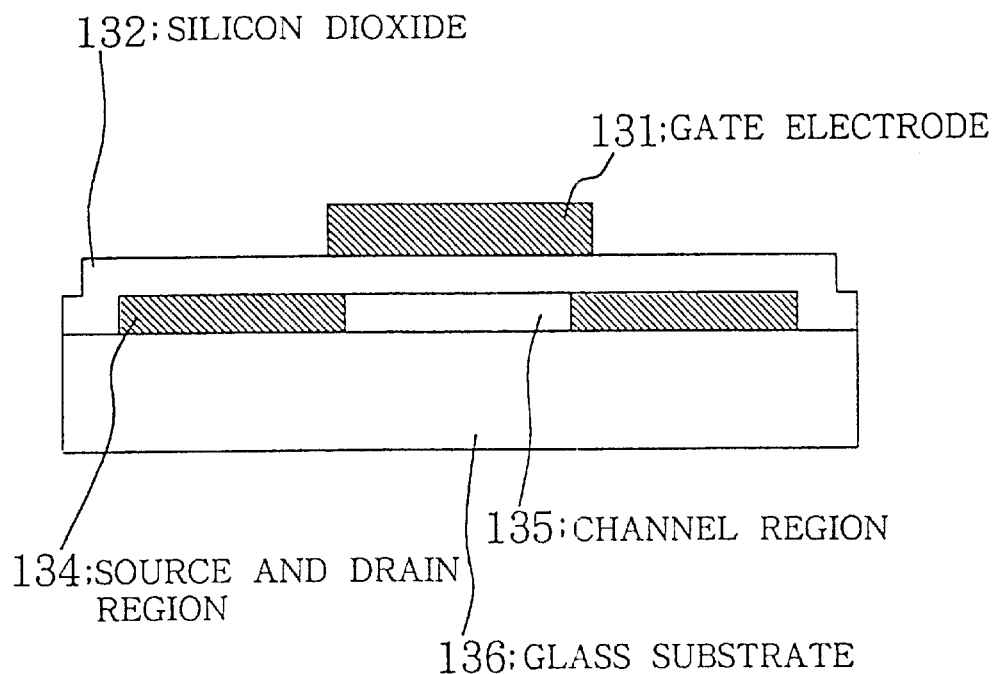
FIG. 14 shows a cross-sectional structure of a thin film transistor according to a sixth embodiment of the invention.

FIG. 14 shows a cross-sectional structure of a thin film transistor according to a sixth embodiment. This thin film transistor comprises a glass substrate 136, and a silicon active layer composed of a source-and-drain region 134 and a channel region 135 and formed on the glass substrate 136. As a gate insulating film, a silicon dioxide film (I) 132 and a silicon dioxide film (II) 133 are formed over the silicon active layer. Over the gate insulating film a gate electrode 131 is disposed.

Figure 15:
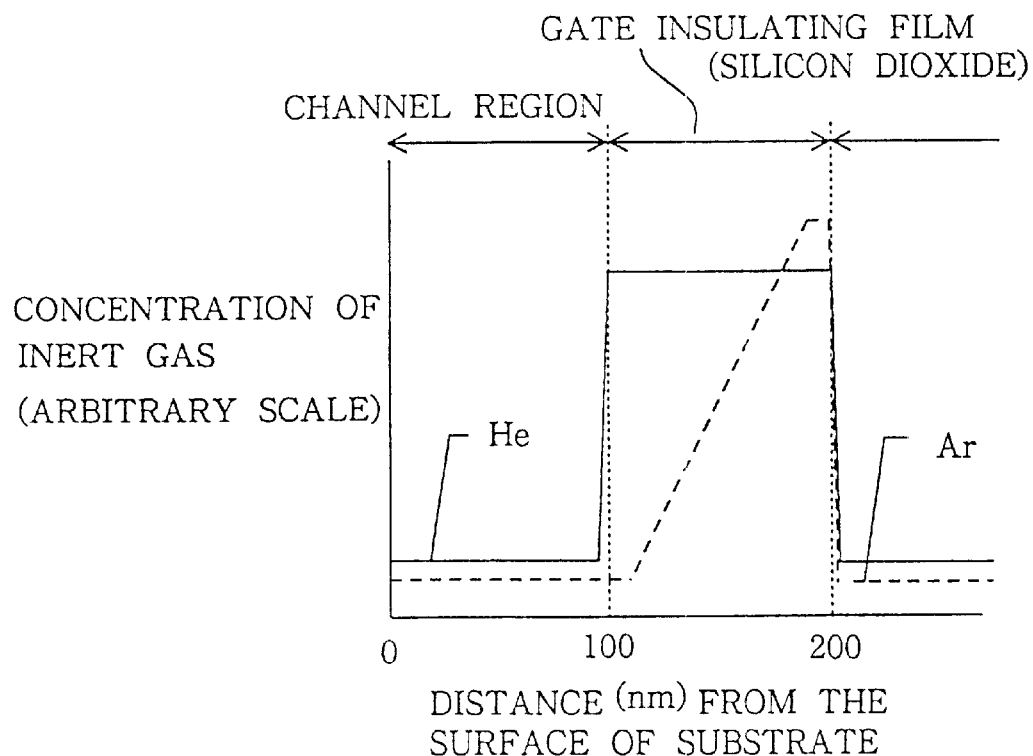
FIG. 15 is a graph showing concentrations of silicon dioxide film layers of the thin film transistor of the sixth embodiment.

The thin film transistor of this embodiment is characterized in that, as shown in FIG. 15, the Ar concentration of the inert gas contained in the silicon dioxide film of the gate insulating film increases from the channel interface toward the gate interface.

This thin film transistor structure can be manufactured in the following fabrication process. Firstly an a-Si:H film is formed on a well-cleaned glass substrate by a thickness of 70 nm by low pressure CVD. After it is dehydrated at 400° for 20 minutes, the a-Si:H film is exposed to KrF excimer laser of 248 nm to form a polysilicon thin film having a desired crystallalinity. Although the intensity and number of times for such laser illumination may be chosen as desired, it is preferable that laser of about 400 mJ/cm² intensity, which enables adequate crystallization without causing film abrasion, is radiated by about 5 shots per cite. By carrying out this laser illumination after solid phase epitaxial growth is carried out place at 600° simultaneously with the performed before laser crystallization, so the activation step at 600° can be omitted.

Then the channel and source-and-drain regions of the thin film transistor are patterned in an island shape by photolithography and dry etching.

Subsequently the resulting transistor structure is well cleaned to remove off the naturally oxidized film existing on its surface, whereupon a gate insulating film is formed by plasma CVD. In formation of the gate insulating film, silane ($SiH_4$) and oxygen ($O_2$) were as a material gas and additionally He (helium) was used as a carrier gas for silane. With Ar used as a carrier gas for oxygen, flow of Ar was continuously increased from 0 sccm at the starting stage of film formation to 200 sccm at the final stage of film formation. A plasma CVD apparatus to be used in formation of the gate insulating film is identical with the apparatus used in the fifth embodiment and shown in FIG. 16.

Embodiment 7

A seventh embodiment of the present invention will now be described with reference to FIGS. 17(a) to 17(j).

As shown in FIGS. 17(a) and 17(b), an amorphous silicon layer is deposited on a glass substrate 61 (preferably coated with a silicon oxide film and a silicon nitride film that are formed by CVD or sputtering) by a thickness of 60 nm by low pressure CVD, whereupon a polysilicon layer 62 is formed over the amorphous silicon layer by KrF excimer laser illumination. Alternatively, the polysilicon layer 62 may be formed by XeCl or XeF excimer laser illustration or solid phase epitaxy instead of KrF excimer laser illustration.

Then a first silicon dioxide film 63 is deposited over the polysilicon film 62 by 20 nm as shown in FIG. 17(c). At that time, a plasma CVD apparatus identical with that of FIG. 16 is used and He (helium) is used as a dilution gas of silane and oxygen.

Then a structure shown in FIG. 17(d) is formed by photolithography and etching; FIG. 17(h) is a side view of this structure as seen in a transverse direction perpendicular to the direction of FIG. 17(d). At that time, by performing the etching step under a condition such that the etching rate of the upper silicon dioxide layer is higher than that of the lower silicon layer, the island shape of silicon dioxide becomes smaller than the island shape of silicon. The resulting island is not steep at its periphery and can therefore be covered by an insulating film in a subsequent covering step with improved reliability.

Then a second silicon dioxide film 64 is formed by a thickness of 80 nm. At that time, by using Ar as a dilution gas of silane and oxygen, a high-insulating-strength precise film was obtained. And an Al/n⁺Si layer 65 is formed as a gate electrode to obtain a structure of FIG. 17(e). FIG. 17(i) is a side view of this structure as seen in a transverse direction perpendicular to the direction of FIG. 17(e).

Subsequently, the gate insulating film is removed in conformity with the patterning shape of the gate, and the unexposed silicon layer is doped with a desired impurity such as phosphorus or boron by self-alignment ion implantation, thus forming a structure of FIG. 17(f). FIG. 17(j) is a side view of this structure as seen in a transverse direction perpendicular to the direction of FIG. 17(f). As an alternative doping means, ion doping may be used in which hydrogen also is put in simultaneously with the impurity. Activation of impurity may be performed by exposing to laser again or by heating at about 600°.

Finally, an interlayer insulating film 66 is formed and then contact holes are formed, whereupon an electrode array 67 is formed to complete a thin film transistor. In this thin film transistor structure, the stepped edges of the island can be covered with the insulating layer precisely.

In the foregoing embodiments, a combination of He and Ar is used as inert gas. Ar may be substituted by neon, krypton, xenon, radon or other inert gas with the similar result. As long as it does not matter if the permittivity is increased, nitrogen or $N_2O$ gas may be used for substitute for Ar.

EXAMPLES

Using the plasma CVD apparatus of FIG. 16, silicon dioxide films were formed under the condition: a substrate temperature of 300°, a film-forming pressure of 133 Pa, an oxygen gas flow of 25 sccm, a silane gas flow of 6 sccm, and an RF power of 50 W. At that time, the film formation conditions and the inert gas concentration in the individual silicon dioxide film are as follows.

Example 1

After a silicon dioxide film was formed by a thickness of 50 nm as both silane and oxygen were diluted with He of 200 sccm, another silicon dioxide film was continuously formed by a thickness of 50 nm as He substituted by Ar of 200 sccm. An analysis conducted under the direction of the present inventor shows that the concentration of He atoms contained in the first-named silicon oxide layer contiguous with the substrate was $9 \times 10^{19}$ cm⁻³, while the concentration of Ar atoms contained in the second-named silicon oxide layer remote from the substrate was $9 \times 10^{19}$ cm⁻³.

Example 2

While silane was constantly diluted with He of 200 sccm and oxygen was gradually diluted with Ar of 0 to 200 sccm (gradually increasing), a 100-nm-thickness silicon dioxide film was formed. An analysis of the inventor shows that the concentration of He atoms contained in the entire silicon oxide film was less than approximately $5 \times 10^{19}$ cm⁻³ and the concentration of Ar atoms contained in the silicon oxide film from the substrate side to the top surface side increased gradually from 0 to approximately $7 \times 10^{19}$ cm⁻³.

Comparative Example 1

While both silane and oxygen were diluted with He of 200 sccm, a 100-nm-thickness silicon dioxide film was formed. An analysis of the inventor shows that the concentration of He atoms contained in the dioxide film was $9 \times 10^{19}$ cm⁻³.

The results of the analyses of the inventor are shown in Table 1. The figures of insulating strength and interface level density in Table 1 were obtained as the result of tests in which the individual silicon dioxide film was formed on a silicon wafer. The step-coverage preciseness was obtained as the result of observation by SEM after the stepped edges of the island of silicon dioxide film formed on a glass substrate was covered with an insulating layer.

TABLE 1

| | Insulating Strength | Interface Level Density | Good step-coverage? |
|---|---|---|---|
| Example 1 | 7 MV/cm | $9.0 \times 10^{11}$ $cm^{-2}eV^{-2}$ | — |
| Example 2 | 8 MV/cm | $9.0 \times 10^{11}$ $cm^{-2}eV^{-2}$ | — |
| Comparative Example 1 | 4 MV/cm | $9.0 \times 10^{11}$ $cm^{-2}eV^{-2}$ | — |
| Comparative Example 2 | 9 MV/cm | $1.0 \times 10^{11}$ $cm^{-2}eV^{-2}$ | — |

N.B.: • stands for the answer "positive".

According to the present invention, using the chemical vapor deposition (CVD), which enables good step-coverage precision, and particularly plasma CVD rather than the physical vapor deposition, which is represented by sputtering high in directivity and not suitable in covering the stepped edges of the island, it is possible to provide a thin film transistor which simultaneously enables (1) lowering the defect level derived from residual stress, dangling bond, impurity, etc. and improving the insulating strength, (2) lowering the interface level derived from incomplete cleaning, plasma damage, etc., and (3) covering stepped edges of the island of semiconductor layers precisely, and it is also possible to provide a method for manufacturing such thin film transistor. Further, since the gate insulating film can be formed at low temperature, it is possible to use inexpensive low-melting-point glass as a substrate, thus reducing the cost of the substrate to a tenth the usual cost and increasing the throughput of the fabrication process by three times. Furthermore it is possible to guarantee a performance equivalent to the silicon dioxide film that was formed at a high temperature of about 1000°.

It is thus apparent that the present invention is not limited to the above embodiments but may be changed and modified without departing from the scope and spirit of the invention.

Finally, the present application claims the priorities of Japanese Patent Applications Nos. Hei9-47874 and Hei9-59152 filed respectively on Mar. 3 and 13, 1997, which are herein incorporated by reference.

What is claimed is:

1. A method for manufacturing a thin film transistor, comprising the steps of:

forming a silicon active layer on a substrate whose at least top surface is an insulator;

forming a first silicon dioxide layer on a top surface of said silicon active layer by CVD using a mixed gas containing a silicon compound, oxygen and a first gas as a carrier gas;

etching said silicon active layer and said first silicon dioxide layer simultaneously in such a manner that regions of said silicon active layer, which are adapted to be prospective channel, source and drain regions of the thin film transistor, are left unetched and that said first silicon dioxide layer becomes smaller in at least one of width or length than said channel, source and drain regions combined; and forming a second silicon dioxide layer, which covers said first silicon dioxide layer and said silicon active layer, by CVD using a mixed gas containing a silicon compound, oxygen and a second gas, which is larger in mass number than said first gas, as carrier gas.

* * * * *